(12) United States Patent
Futase et al.

(10) Patent No.: US 6,737,221 B2
(45) Date of Patent: May 18, 2004

(54) MASS PRODUCTION METHOD OF SEMICONDUCTOR INTEGRATED CIRCUIT DEVICE AND MANUFACTURING METHOD OF ELECTRONIC DEVICE

(75) Inventors: Takuya Futase, Fussa (JP); Tomonori Saeki, Yokohama (JP); Mieko Kashi, Yokohama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/424,854

(22) Filed: Apr. 29, 2003

(65) Prior Publication Data

US 2003/0207214 A1 Nov. 6, 2003

Related U.S. Application Data

(63) Continuation of application No. 10/245,503, filed on Sep. 18, 2002, now Pat. No. 6,586,161, which is a continuation of application No. 09/635,569, filed on Aug. 9, 2000, now abandoned.

(30) Foreign Application Priority Data

Aug. 31, 1999 (JP) ............................................. 11-245143
Dec. 20, 1999 (JP) ............................................. 11-360349

(51) Int. Cl.[7] ................................................ B08B 3/04
(52) U.S. Cl. ........................ 430/311; 430/322; 427/250; 427/561; 427/576; 216/83; 216/18; 134/902
(58) Field of Search ................................. 430/311, 322; 427/250, 561, 576; 216/83, 18; 134/902

(56) References Cited

U.S. PATENT DOCUMENTS

| | | | |
|---|---|---|---|
| 5,409,569 A | 4/1995 | Seki et al. | 156/662 |
| 6,136,708 A | 10/2000 | Aoki | 438/687 |
| 6,162,301 A | 12/2000 | Zhang et al. | 134/3 |

(List continued on next page.)

FOREIGN PATENT DOCUMENTS

| | | |
|---|---|---|
| EP | 1 037 261 | 9/2000 |
| EP | 1 055 463 | 11/2000 |
| JP | 5-3184 | 1/1993 |

(List continued on next page.)

OTHER PUBLICATIONS

*Chemistry Handbook, Basic Version II*, 4th Revised Edition, Published on Sep. 30, 1993, Edited by the Chemical Society of Japan, pp. II–464 through II–469 (with translation).

Pourbaix, Marcel, *Atlas of Electrochemical Equilibria in Aqueous Solutions*, Chapter IV, Section 13.1, pp. 343–349 (1974).

Lossberg et al., "A Method for the Preparation of Anhydrous Ruthenium (VIII) Oxide", Z. Naturforsch, 36b, 395 (1981) (with translation).

Shyam Murarka, et al., "Integrated Process Technology for Copper ICS", *Copper–Fundamental Mechanisms for Microelectronic Applications*, Mar. 10, 2000, pp. 302–311 and cover pages.

*Primary Examiner*—Mark F. Huff
*Assistant Examiner*—Daborah Chacko-Davis
(74) *Attorney, Agent, or Firm*—Miles & Stockbridge P.C.

(57) ABSTRACT

In order to prevent the contamination of wafers made of a transition metal in a semiconductor mass production process, the mass production method of a semiconductor integrated circuit device of the invention comprises the steps of depositing an Ru film on individual wafers passing through a wafer process, removing the Ru film from outer edge portions of a device side and a back side of individual wafers, on which said Ru film has been deposited, by means of an aqueous solution containing orthoperiodic acid and nitric acid, and subjecting said individual wafers, from which said Ru film has been removed, to a lithographic step, an inspection step or a thermal treating step that is in common use relation with a plurality of wafers belonging to lower layer steps (an initial element formation step and a wiring step prior to the formation of a gate insulating film).

3 Claims, 22 Drawing Sheets

U.S. PATENT DOCUMENTS

| | | | |
|---|---|---|---|
| 6,165,956 A | 12/2000 | Zhang et al. | 510/175 |
| 6,261,849 B1 | 7/2001 | Lee | 438/3 |
| 6,287,477 B1 | 9/2001 | Hacker et al. | 216/83 |
| 6,294,027 B1 | 9/2001 | Li et al. | 134/3 |
| 6,303,551 B1 | 10/2001 | Li et al. | 510/175 |
| 6,322,598 B1 | 11/2001 | Meuris et al. | 29/25.01 |
| 6,387,190 B1 | 5/2002 | Aoki et al. | 134/28 |
| 6,558,478 B1 * | 5/2003 | Katakabe et al. | 134/33 |
| 6,615,854 B1 * | 9/2003 | Hongo et al. | 134/148 |
| 2001/0029104 A1 | 10/2001 | Aoki | 438/692 |

FOREIGN PATENT DOCUMENTS

| | | |
|---|---|---|
| JP | 6-318584 | 11/1994 |
| JP | 7-157832 | 6/1995 |
| JP | 7-224333 | 8/1995 |
| JP | 9-246224 | 9/1997 |
| JP | 10-64856 | 3/1998 |
| JP | 11-312657 | 11/1999 |
| JP | 11-330023 | 11/1999 |
| JP | 2000-269178 | 9/2000 |
| JP | 2000-306877 | 11/2000 |
| JP | 2000-331975 | 11/2000 |

* cited by examiner

* THE DIFFUSION STEP INDICATES THOSE STEPS BEFORE THE FORMATION OF A GATE W FILM, AND THE WIRING STEP INDICATES THE STEPS BEFORE THE FORMATION OF A NEW MATERIAL FILM.

ETCHING RATE OF Ru WITH DIFFERENT TYPES OF CLEANING FLUIDS (40°C)

| CHEMICALS | MIXING RATIO | ETCHING RATE (nm/min) |
|---|---|---|
| $HCl/H_2O_2/H_2O$ | 1:1:8 | <0.1 |
| $NH_3/H_2O_2/H_2O$ | 1:1:8 | <0.1 |
| $HF/H_2O_2/H_2O$ | 1:1:8 | <0.1 |
| $HCl/HF/H_2O_2/H_2O$ | 1:1:1:7 | <0.1 |
| $HF/HNO_3$ | 1:9 | <0.1 |
| $HCl/HNO_3$ | 3:1 | <0.1 |
| $H_2SO_4/H_2O_2$ (120°C) | - | <0.1 |
| OXYGEN AERATED HCl | - | <0.1 |
| $O_3$ AERATED $H_2SO_4$ (90°C) | - | <0.1 |
| $O_3$ AERATED TMAH (90°C) | - | <0.1 |
| $O_3$ AERATED HCl (90°C) | - | <0.1 |

FIG. 16

| OXIDIZING AGENT | ACIDITY | | |
| --- | --- | --- | --- |
| | OXIDATION-REDUCTION POTENTIAL (pH=0) (V) | CONCENTRATION OF OXIDIZING AGENT (mol/LITER) | ETCHING RATE (nm/min) |
| PEROXODISULFATE | 1.96 | 1.0 | <0.1 |
| HYDROGEN PEROXIDE | 1.76 | 4.4 | <0.1 |
| SODIUM HYPOCHLORITE | 1.72 | 0.8 | <0.1 |
| SODIUM META-PERIODATE | 1.65 | 0.003 | <0.1 |
| ORTHO-PERIODIC ACID | 1.6 | 1.0 | 13.7 |
| CHLORIC ACID | 1.45 | 1.0 | <0.1 |
| IODINE | 0.54 | 0.2 | <0.1 |

| OXIDIZING AGENT | ALKALINITY | | |
| --- | --- | --- | --- |
| | OXIDATION-REDUCTION POTENTIAL (pH=14) (V) | CONCENTRATION OF OXIDIZING AGENT (mol/LITER) | ETCHING RATE (nm/min) |
| PEROXODISULFATE | 1.96 | 0.6 | <0.1 |
| HYDROGEN PEROXIDE | 0.94 | 1.0 | <0.1 |
| SODIUM HYPOCHLORITE | 0.89 | 0.8 | 82.4 |
| SODIUM META-PERIODATE | 0.82 | 0.8 | 7.5 |
| ORTHO-PERIODIC ACID | 1.19 | 0.8 | 4.8 |
| CHLORIC ACID | 0.62 | – | – |
| IODINE | 0.54 | 0.2 | <0.1 |

POTENTIAL NECESSARY FOR THE OXIDATION OF Ru
E=1.13V (pH=0)   E=0.30V (pH=14)

| HNO3 | H5IO6 | RATE (nm/min) |
|---|---|---|
| 0 | 10 | 64.6 |
| 1 | 10 | 137.3 |
| 2 | 10 | 155.1 |
| 5 | 10 | 113.8 |
| 10 | 10 | 71.4 |

| HNO3 | H5IO6 | RATE (nm/min) |
|---|---|---|
| 0 | 10 | 40 |
| 1 | 10 | 130.4 |
| 2 | 10 | 136.4 |
| 5 | 10 | 109.1 |
| 10 | 10 | 85.7 |

| HNO3 | H5IO6 | RATE (nm/min) |
|---|---|---|
| 0 | 10 | 21.6 |
| 1 | 10 | 42.9 |
| 2 | 10 | 77 |
| 5 | 10 | 92.3 |
| 10 | 10 | 82.2 |

| HNO3 | H5IO6 | RATE (nm/min) |
|---|---|---|
| 0 | 10 | 9.7 |
| 1 | 10 | 35.5 |
| 2 | 10 | 40 |
| 5 | 10 | 50.4 |
| 10 | 10 | 45.5 |

FIG. 20

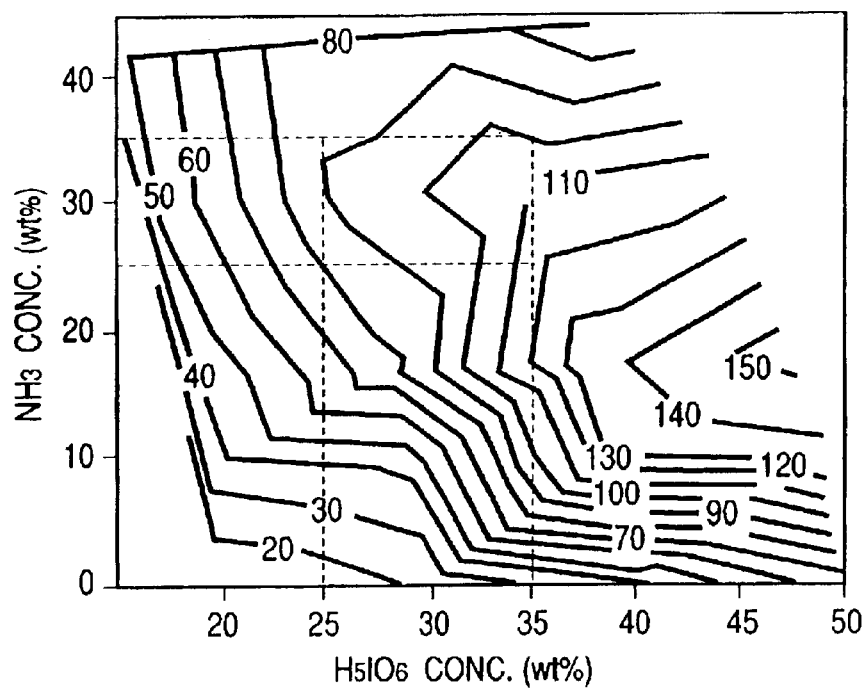

FIG. 21

| ACID | RATE (nm/min) | MAKER |
|---|---|---|
| NOT ADDED | 64.6 | |
| $HNO_3$ | 155.1 | 69.5% (EL) @SUMITOMO CHEMICAL CO., LTD. |
| $CH_3COOH$ | 138.1 | 98% (EL) @KANTO CHEMICAL CO., INC. |
| HCl | NG | 36% (EL) @KANTO CHEMICAL CO., INC. |
| $H_2O_2$ | NG | 30% (EL) @KANTO CHEMICAL CO., INC. |

THE RATE INCREASES BY ADDITION OF NITRIC ACID OR ACETIC ACID, AND DECREASES BY ADDITION OF SULFURIC ACID.
HYDROCHLORIC ACID IS NOT GOOD BECAUSE OF THE GENERATION OF CHLORINE, AND HYDROGEN PEROXIDE IS NOT GOOD BECAUSE OF THE PRECIPITATION OF IODINE.

MASS PRODUCTION METHOD OF SEMICONDUCTOR INTEGRATED CIRCUIT DEVICE AND MANUFACTURING METHOD OF ELECTRONIC DEVICE

CROSS-REFERENCE TO RELATED APPLICATIONS

This application is a continuation of application Ser. No. 10/245,503 filed Sep. 18, 2002, now U.S. Pat. No. 6,586,161, which is a continuation of application Ser. No. 09/635,569 filed Aug. 9, 2000.

BACKGROUND OF THE INVENTION

This invention relates to a mass production technique of a semiconductor integrated circuit device, and more particularly, to a technique effectively applicable to a semiconductor production process, in which when a large number of wafers are continuously processed over a plurality of steps, the process is carried out in a mass production line wherein the lithographic step of wafers on which a film containing a transition metal such as ruthenium (Ru) is deposited and the lithographic step of wafers belonging to other steps are commonly used.

In the industrial fields other than that of the manufacture of a semiconductor, there is known a technique wherein a platinum group element is dissolved in a dissolution solution and isolated for the purpose of collecting the platinum group element from wastes or the like.

Japanese Laid-open Patent Publication No. Hei 7-157832 (Ito et al.) discloses a technique of recovering noble metals, such as gold, platinum group elements and the like, from used electronic parts, noble metal-containing, wasted catalysts, and a used jewelry by dissolution thereof in a dissolving solution. For the dissolution of noble metals, there is used a dissolving solution which is obtained by mixing an aqueous solution of an inter-halogen compound (e.g. ClF, BrF, BrCl, ICl, $ICl_3$, IBr or the like) and an aqueous solution of a halogenated oxoacid (iodic acid, bromic acid, chloric acid or the like) at a ratio in the range of 1:9 to 9:1 The noble metal dissolved in the solution is first separated as a halogenated complex, to which a solution of a compound (e.g. sodium hydroxide, sodium borohydride, hydrazine or its salt, sulfurous acid or its salt, a bisulfite or the like) is then added, thereby collecting the metal.

Japanese Laid-open Patent Application No. Hei 7-224333 (Wada et al) discloses a technique of dissolving out, in the form of an aqueous solution, an alloy formed by nuclear fission and containing noble metals, such as ruthenium (Ru), rhodium (Rh), palladium (Pd) without undergoing such a pretreatment as by liquid metal extraction by immersing the alloy in a dissolving solution of hydroiodic acid (or hydrobromic acid), to which an iodine simple element is added. It is stated that the dissolving solution has a concentration of hydroiodic acid (or hydrobromic acid) ranging from 5 to 57 wt %, and a concentration of the added iodine simple element ranging from 0.01 to 0.5 moles per liter of the former aqueous solution.

SUMMARY OF THE INVENTION

In order to ensure an accumulated charge quantity of finely divided memory cells, a great capacitance DRAM (Dynamic Random Access Memory) of 1 Gbit or over has a capacitance insulating film of an information storage capacitor constituted of a high dielectric material such as an $ABO_3$-type composite oxide having a specific inductive capacity of 100 or over, i.e. a perovskite composite oxide of BST (Ba, Sr) $TiO_3$.) For use as a capacitance insulating film material of the next generation, studies have been made on ferrodielectric materials having a perovskite crystal structure such as of PZT ($PbZr_xTi_{1-x}O_3$), PLT ($PbLa_xTi_{1-x}O_3$), PLZT, SBT, $PbTiO_3$, $SrTiO_3$ and $BaTiO_3$.

Where such a high/ferrodielectric material is used for the capacitance insulating film of a capacitor, it is necessary that conductive films for upper and lower electrodes sandwiching the capacitance insulating film therebetween should be each made mainly of a metal having high affinity for the high/ferrodielectric material, e.g. a platinum group metal (e.g. Ru (ruthenium), Rh (rhodium), Pd (palladium), Os (osmium), Ir (iridium) or Pt (platinum). Especially, ruthenium (Ru) is considered to be full of promise for use as an electrode material of a capacitor wherein the capacitance insulating film is constituted of such a high/ferrodielectric material because of its excellent etching controllability and film stability.

On the other hand, as a countermeasure for preventing an increase in wiring resistance caused by the scale down of a wiring width and the lowering of reliability in the field of high-speed logic LSI's, there has now been introduced copper wirings buried according to a so-called Damascene method. In the method, wiring grooves (and through-holes) are formed in an insulating film deposited on a substrate, and a copper (Cu) film having an electric resistance lower than an Al film is deposited on the insulating film including the inner surfaces of the wiring grooves (and the through-holes), followed by removal of an unnecessary copper film outside of the wiring grooves by a chemical mechanical polishing (CMP) method, the introduction of the buried copper wirings is now under study not only in the field of logic LSD, but also in the field of memories such as DRAM.

However, in order to introduce newcomer transition metals, such as the above-mentioned platinum group metals, perovskite-type high/ferrodielectrics and copper, which have never been in use in known wafer processes, and materials comprising the transition metals, into a semiconductor production process, it is essential to take a measure for preventing wafers from contamination with these transition metals. Especially, a transition metal such as copper has a great coefficient of diffusion in silicon (Si) and readily arrives at a substrate when undergoing an annealing step (thermal treatment step), with the great apprehension that it gives a serious adversely influence on device characteristics even at a very small concentration.

For instance, in the manufacturing process of general-purpose LSI's such as DRAM, a facility investment is suppressed to a minimum to reduce product costs, so that lithographic devices (such as a light exposure device and an EB exposure device), various types of inspection devices, and an annealing (thermal treating) device are commonly used in an initial element-forming step and a wiring step prior to the formation of a gate insulating film. These common devices are employed in the step of forming capacitors by use of such a newcomer material as set out hereinabove. More particularly, after transfer, from the common devices, of a wafer used for carrying out the capacitor-forming step, a fresh wafer used for carrying out the initial element-forming step or used for carrying out the wiring step is, in turn, transferred into the devices. In case where the buried copper wiring formed according to the Damascene method is provided as the wiring formed as an upper layer of the capacitor, a wafer having a copper film deposited on as an upper layer of the capacitor is transferred to the common devices for annealing (thermal treatment) after or prior to the transfer of another wafer to be subjected to other steps.

A film containing a platinum group metal, a perovskite-type high/ferrodielectric material or a transition metal such as copper, which has been deposited on the device side of a wafer according to a sputtering method or a CVD method, is also deposited on the outer marginal portions (edge portions) or the back side of the wafer. In this condition, when the wafer, from which the transition metal-containing film deposited on the outer edge portions or the back side of the wafer, is transferred to the common devices without removing the film to a satisfactory extent, a wafer stage, a wafer carrier, a conveyor and the like, which has come into contact with the outer edge portion or the back side of the wafer, are deposited on the surface thereof with the transition metal-containing film. This results in the contamination, with the transition metal, of a wafer which will be subsequently transferred to the common devices for performing lower layers steps (such as the step of forming an initial element and the wiring step prior to the formation of a gate insulating film).

Accordingly, in the mass production line for carrying out, by use of the common devices, the lithographic step for the wafer deposited thereon with a transition metal-containing film as stated above and the lithographic step for the wafers belonging to other steps including the lower layers steps, it is essential to provide a cleaning step of removing the transition metal-containing film deposited on the outer edge portions and the back side of a wafer prior to the transfer of the transition metal-containing film-deposited wafer.

However, a solution for dissolving, for example, ruthenium among the afore-indicated transition metals has not been found so that an effective cleaning method therefor has not been established yet. As having set out before, several types of solutions for dissolving platinum group metals have been proposed in the industrial fields other than that of the manufacture of semiconductor. However, these dissolving solutions are so low in dissolving rate of ruthenium that they cannot be used in the mass production line of semiconductor.

Another measure for preventing the contamination of a wafer with a transition metal is to provide an exclusive device for carrying out the lithographic step for the wafer deposited with a transition metal-containing film, separately from the common devices. Nevertheless, this is not of practical value from the standpoint of reduction in production cost.

An object of the invention is to provide a technique of reliably preventing the inconvenience of a wafer being contaminated with a transition metal when the wafer is subjected to an initial element formation step and a wiring step in the semiconductor mass production line wherein an initial element formation step and a wiring step, and a lithographic device, inspection devices, an annealing (thermal treating) device and the like in a transition metal-containing film processing step are commonly used prior to the formation of a gate insulating film.

This and other objects and features of the invention will become apparent from the description of the invention with reference to the accompanying drawings.

Of the embodiments disclosed in the invention, typical ones are briefly described or summarized below.

The mass production of a semiconductor integrated circuit device of the invention comprises the steps of:

(a) depositing a Ru film on individual wafers being in passage of a wager process (b) removing the Ru film from outer edge portions on a device side of the individual wafers, on which the Ru film has been deposited, and a back side thereof with use of a solution containing an orthoperiodic acid; and (c) subjecting the individual wafers, from which the Ru film has been removed, to a lithographic step, an inspection step or a thermal treating step which is in common use with plural types of wafers belonging to lower layers steps.

The summary of the invention other than the above-stated one is briefly itemized as numbered below.

1. A mass production method of a semiconductor integrated circuit device comprising the steps of:

(a) depositing a platinum group metal film on a device side of a first wafer among a plurality of wafers passing through a wafer process;

(b) removing the platinum group metal film from outer edge portions of the device side or a back side of the first wafer, on which the platinum group metal film has been deposited;

(c) patterning, after the step (b), the platinum group metal film on the device side of the first wafer through an etching-resistant mask pattern formed in a lithographic step;

(d) depositing a film to be processed different in type from the platinum group metal film on a device side of a second wafer among the plurality of wafers passing through the wafer process; and (e) patterning the film to be processed, which has been deposited on the device side of the second wafer, by the lithographic step.

2. A mass production method of a semiconductor integrated circuit device as recited in 1 above, characterized in that the platinum group metal film is made of a ruthenium film.

3. A mass production method of a semiconductor integrated circuit device as recited in 1 or 2 above, characterized in that the step of patterning the film to be processed is a lower layer step in comparison with the step of patterning the platinum group metal film.

4. A mass production method of a semiconductor integrated circuit device as recited in any one of 1 to 3 above, characterized in that the platinum group metal film is removed by use of a solution containing an orthoperiodic acid.

5. A mass production method of a semiconductor integrated circuit device as recited in any one of 1 to 4 above, characterized in that the platinum group metal film is removed by use of a solution containing an orthoperiodic acid and a second acid.

6. A mass production method of a semiconductor integrated circuit device as recited in 5 above, characterized in that the second acid is made of nitric acid.

7. A mass production method of a semiconductor integrated circuit device as recited in 6 above, characterized in that the solution has a concentration of orthoperiodic acid of 20 wt % to 40 wt %, and a concentration of nitric acid of 20 to 40 wt %.

8. A mass production method of a semiconductor integrated circuit device as recited in 6 above, characterized in that the solution has a concentration of orthoperiodic acid of 25 wt % to 35 wt %, and a concentration of nitric acid of 25 to 35 wt %.

9. A mass production method of a semiconductor integrated circuit device as recited in 5 above, characterized in that the second acid is made of acetic acid.

10. A mass production method of a semiconductor integrated circuit device as recited in any one of 1 to 9 above, characterized in that the platinum group metal film is removed, at least, from substantially an entire surface of the back side of the individual wafers and the outer edge portions of the device side.

11. A mass production method of a semiconductor integrated circuit device comprising the steps of:
  (a) depositing a transition metal-containing film on a device side of a first wafer among a plurality of wafers passing through a wafer process;
  (b) removing the transition metal-containing film from outer edge portions of the device side or a back side of the first wafer, on which the transition metal-containing film has been deposited;
  (c) patterning, after the step (b), the transition metal-containing film on the device side of the first wafer through an etching-resistant mask pattern formed in a lithographic step;
  (d) depositing a film to be processed different in type from the transition metal-containing film on a device side of a second wafer among the plurality of wafers passing through the wafer process; and
  (e) patterning the film to be processed, which has been deposited on the device side of the second wafer, by the lithographic step.

12. A mass production method of a semiconductor integrated circuit device as recited in 11 above, characterized in that the transition metal-containing film is made of a perovskite-type high dielectric material or ferrodielectric material.

13. A mass production method of a semiconductor integrated circuit device as recited in 12 above, characterized in that the perovskite-type high dielectric material or ferrodielectric material is made of BST.

14. A mass production method of a semiconductor integrated circuit device as recited in 11 above, characterized in that the perovskite-type high dielectric material or ferrodielectric material is PZT, PLT, PLZT, SBT, $PbTiO_3$, $SiTiO_3$ or $BaTiO_3$.

15. A mass production method of a semiconductor integrated circuit device as recited in 11 above, characterized in that the transition metal is made of copper.

16. A mass production method of a semiconductor integrated circuit device comprising the steps of:
  (a) depositing a Ru film on a device side of a first wafer among a plurality of wafers passing through a wafer process;
  (b) removing the Ru film from outer edge portions of the device side or a back side of the first wafer, on which the Ru film has been deposited;
  (c) patterning, after the step (b), the Ru film on the device side of the first wafer through an etching-resistant mask pattern formed in a lithographic step, thereby forming a capacitor electrode;
  (d) depositing a film to be processed different in type from the Ru film on a device side of a second wafer among the plurality of wafers passing through the wafer process; and
  (e) patterning the film to be processed, which has been deposited on the device side of the second wafer, by the lithographic step.

17. A mass production method of a semiconductor integrated circuit device as recited in 16 above, characterized in that the step of patterning the film to be processed is a lower layer step downstream of or in comparison with the step of patterning the Ru film.

18. A mass production method of a semiconductor integrated circuit device as recited in 16 or 17 above, characterized in that the Ru film is removed by use of a solution containing orthoperiodic acid.

19. A mass production method of a semiconductor integrated circuit device as recited in 16 or 17 above, characterized in that the Ru film is removed by use of a solution containing an orthoperiodic acid and a second acid.

20. A mass production method of a semiconductor integrated circuit device as recited in 19 above, characterized in that the second acid is made of nitric acid.

21. A mass production method of a semiconductor integrated circuit device as recited in 20 above, characterized in that the solution has a concentration of orthoperiodic acid of 20 wt % to 40 wt %, and a concentration of nitric acid of 20 to 40 wt %.

22. A mass production method of a semiconductor integrated circuit device as recited in 20 above, characterized in that the solution has a concentration of orthoperiodic acid of 25 wt % to 35 wt %, and a concentration of nitric acid of 2.5 to 35 wt %.

23. A mass production method of a semiconductor integrated circuit device comprising the steps of:
  (a) depositing a Ru film on a device side of a first wafer among a plurality of wafers passing through a wafer process;
  (b) removing the Ru film from outer edge portions of the device side or a back side of the first wafer, on which the Ru film has been deposited, by use of a solution containing orthoperiodic acid;
  (c) patterning, after the step (b), the Ru film on the device side of the first wafer through an etching-resistant mask pattern formed in a lithographic step, thereby forming a capacitor electrode of DRAM;
  (d) depositing a film to be processed different in type from the Ru film on a device side of a second wafer among the plurality of wafers passing through the wafer process; and
  (e) patterning the film to be processed, which has been deposited on the device side of the second wafer, by the lithographic step.

24. A mass production method of a semiconductor integrated circuit device as recited in 23 above, characterized in that the step of patterning the film to be processed is a lower layer step downstream of or in comparison with the step of patterning the Ru film.

25. A mass production method of a semiconductor integrated circuit device as recited in 24 above, characterized in that the step of patterning the film to be processed is a step of forming a gate electrode or a step of forming a bit line.

26. A mass production method of a semiconductor integrated circuit device as recited in any one of 23 to 25 above, characterized in that the Ru film is removed by use of a solution containing orthoperiodic acid and nitric acid.

27. A mass production method of a semiconductor integrated circuit device as recited in 26 above, characterized in that the solution has a concentration of orthoperiodic acid of 20 wt % to 40 wt %, and a concentration of nitric acid of 20 to 40 wt %.

28. A mass production method of a semiconductor integrated circuit device as recited in 27 above, characterized in that the solution has a concentration of orthoperiodic acid of 25 wt % to 35 wt %, and a concentration of nitric acid of 25 to 35 wt %.

29. A mass production method of a semiconductor integrated circuit device comprising the steps of:
  (a) depositing a film containing a transition metal made of a perovskite-type high dielectric material or ferrodielectric material on a device side of a first wafer among a plurality of wafers passing through a wafer process;
  (b) removing the transition metal-containing film from outer edge portions of the device side or a back side of the first wafer, on which the transition metal-containing film has been deposited;

(c) patterning, after the step (b), the transition metal-containing film on the device side of the first wafer through an etching-resistant mask pattern formed in a lithographic step, thereby forming a capacitance insulating film of a capacitor of DRAM;

(d) depositing a film to be processed different in type from the transition metal-containing film on a device side of a second wafer among the plurality of wafers passing through the wafer process; and (e) patterning the film to be processed, which has been deposited on the device side of the second wafer, by the lithographic step.

30. A mass production method of a semiconductor integrated circuit device as recited in 29 above, characterized in that the perovskite-type high dielectric material or ferrodielectric material is made of BST.

The general meanings of the terms used in the present invention are illustrated below.

1. The term "CMIS integrated circuit" is intended to mean an integrated circuit made of a complementary insulation gate-type FET including, aside from general CMOS integrated circuits, devices having a gate insulating film made, for example, of a dielectric material other than an oxide film such as silicon nitride or tantalum oxide.

2. The term "device side" means a main surface of a wafer, on which an integrated circuit pattern corresponding to a plurality of chip regions is formed by photolithography. That is, "device side" is an opposite side of "back side".

3. The term "buried wiring" means one wherein a groove is formed in an insulating film as in single Damascene or dual Damascene, and a conductive film such as copper is buried in the groove, followed by removal of an unnecessary conductive film through patterning by a wiring-forming technique.

4. The term "semiconductor integrated circuit water" or "semiconductor wafer" is intended to mean a silicon single crystal substrate (usually, substantially in a circular form), a sapphire substrate, a glass substrate, other insulating, anti-insulating and semiconductive substrates, and composite substrates thereof. The term "semiconductor integrated circuit device" (or "electronic device", "electronic circuit device" and the like) means not only a device formed on a single crystal silicon substrate, but also those devices formed on various types of above-mentioned substrates, or other types of substrates including an SOI (silicon on insulator) substrate, a TFT (thin film transistor) liquid crystal-manufacturing substrate, an STN (super twisted nematic) liquid crystal-manufacturing substrate and the like unless otherwise indicated.

5. The term "chip-forming portion" means a portion including a plurality of chip regions on the device side of a wafer, indicating an inner region except "an outer edge portion" where it is not intended to make a peripheral chip".

6. The term "high dielectric material" means a high dielectric material having a specific inductive capacity of 20 or over, such as $Ta_2O_5$, and a high dielectric material having a specific inductive capacity exceeding 100, such as BST ((Ba, Sr) $TiO_3$).

7. The term "ferrodielectric material" means PZT, PLT, PLZT, SBT, $PbTiO_3$, $SrTiO_3$ and $BaTiO_3$, which, respectively, have a perovskite structure in a ferrodielectric phase at normal temperatures.

8. The term "transition metal" generally means elements of group 3, to which yttrium, lanthanum and the like belong, to group 11, to which copper and the like belongs, of the periodic table. The term "transition metal-containing film" means a film which comprises a material containing a transition metal, or a transition metal as a major or minor proportion of an constituent element (e.g. Ru, $RuO_2$, $Ta_2O_5$ and the like). The term "transition metal-containing film deposition treatment" means a treatment wherein the above-mentioned transition metal-containing film is attached to or deposited purposely or unintentionally. Accordingly, the treatment includes, aside from the step of depositing an insulating film or a metal film, an etching step. In the practice of the invention, the term "harmful transition metal" means one which is not adequately evidenced with respect to the nature as a contaminant among transition metals employed in a semiconductor process and is selected, for example, from platinum and copper group elements. Moreover, the term "made of copper" used herein is not limited to pure copper alone, but includes copper containing other constituent element, additive, impurity and the like in amounts not impeding the function thereof unless otherwise indicated.

9. The term "platinum group element" generally means ruthenium, rhodium, palladium, osmium, iridium and platinum among the elements generally belonging to the groups 8 to 10 of the periodic table.

10. The term "lower layers steps" used in a wafer process means a group of a series of steps including the step of formation of a film to be processed, the step of formation of a resist, the steps of exposure, development and patterning of the film, and the like precedent to an intended step when attention is paid to one wafer. For instance, lower wiring steps are a lower layer process or step in comparison with upper wiring steps. The reverse is called "upper layer steps". It will be noted that these definitions do not always mean a physical upstream or downstream relationship.

11. The term "lithographic step" means that with the case of light exposure, for example, the step covers from the step of coating a photoresist onto a wafer after the step of formation of a given film to the step of exposing the photoresist to light and developing the exposed photoresist (including the baking step, if necessary) The common use relation in the lithographic step means the relation where wafers belonging to different steps pass through a lithographic step made of the same arrangement. In this case, the same arrangement does not include all devices in common use. One of devices, e.g. an exposure device (e.g. a light exposure device, an EB exposure device or the like), may be in common use.

12. The term "mass production" in a wafer line generally means a throughput of approximately 1000 wafers/day. In the practice of the invention, taking the tendency toward a large-sized wafer into account, a throughput of approximately 100 wafers/day is included for the mass production. In this case, it is as a matter of course that the same type of wafer is used for the purpose.

13. The-term "chemical mechanical polishing (CMP)" generally means one wherein while a surface to be polished is in contact with a polishing pad made of a relatively soft cloth-like sheet material under which a slurry is supplied, they are relatively moved along the surface. Beside, CML (chemical mechanical lapping), in which a surface to be polished is moved relative to the surface of a hard grind stone, may be included in the practice of the invention.

BRIEF DESCRIPTION OF THE DRAWINGS

FIG. 16 is a table showing the etching rate of Ru depending on different types of oxidizing agents;

FIGS. 19(a) to 19(d) are, respectively, a table showing the relation between the mixing ratio of nitric acid and the etching rate when Ru is etched by use of an orthoperiodic acid aqueous solution, to which a nitric acid aqueous solution is added;

FIG. 20 is a graph showing, as a contour, the etching rate of Ru with a solution obtained by adding a nitric acid aqueous solution to an orthoperiodic acid aqueous solution;

FIG. 21 is a table showing the variation in etching rate of Ru when different types of commercially available acids are, respectively, added to an orthoperiodic acid aqueous solution;

DETAILED DESCRIPTION OF THE PREFERRED EMBODIMENTS

Figure 1:
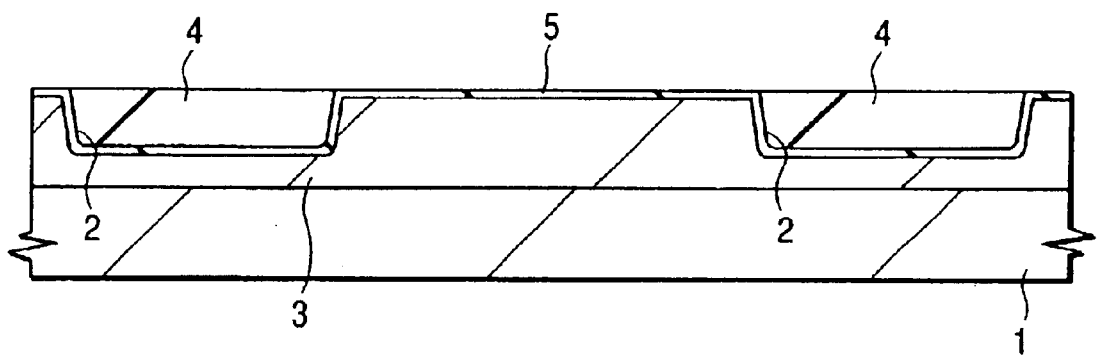
FIG. 1 is a sectional view of an essential part of a semiconductor substrate showing a mass production method of a semiconductor integrated circuit device according to one embodiment of the invention.

The embodiments of the invention are described in detail with reference to the accompanying drawings. It should be noted that throughout the drawings illustrating the embodiments, like reference numerals, respectively, indicate like members having the same functions, and are not repeatedly illustrated. In the following embodiments, the same or similar parts or portions are not basically described repeatedly except the case of necessity.

In the following embodiments, if need be for convenience's sake, a plurality of sections or division into embodiments is illustrated. With the exception of the case indicated specifically, these are not mutually unrelated, and one may be in relation with variations and detailed and supplementary description relative to part or all of others. Moreover, in the following embodiments, where reference is made to the number of elements (including the number, value, amount, range and the like), it should not be construed as limiting to a specified number unless otherwise indicated or except the case where such a number is principally, apparently limited to the specified number. The number over or below the specified number may be within the scope of the invention. In addition, in the following embodiments, the constituting elements (including elemental steps) are not necessarily essential unless otherwise indicated or except the case where such elements are principally, apparently essential.

Likewise, in the following embodiments, where reference is made to the shape and positional relation of a constituting element, those substantially close or similar to the shape and the like are within the scope of the invention unless otherwise indicated or except the case where such is not a case principally and apparently. This is true of the numerical values and their ranges.

EXAMPLE 1

The production process of DRAM according to an embodiment of the invention is described step by step with reference to FIGS. 1 to 28.

As shown in FIG. 1, after formation of an element isolation groove 2 in a main surface of a semiconductor substrate (wafer) 1 made, for example, of p-type single crystal silicon having a specific resistance of approximately 10 Ωcm, a p-type well 3 is formed in the substrate 1. The element isolation groove 2 is formed by forming a groove by dry etching of the substrate 1 at an element isolation region thereof, depositing a silicon oxide film 4 over the substrate 1 including the inside of the groove according to a CVD method and polishing the silicon oxide film 4 by a chemical mechanical polishing (CMP) method to leave it in the groove. The p-type well 3 is formed by ion implanting an n-type impurity, e.g. P (phosphorus) into the substrate 1 and annealing (thermally treating) the substrate 1 to permit the n-type impurity to be diffused.

Next, the p-type well 3 is cleaned on the surface thereof with a hydrofluoric acid-based (HF) cleaning solution, after which the substrate 1 is wet oxidized to form a clean gate oxide film 5 on the surface of the p-type well 3.

Figure 2:
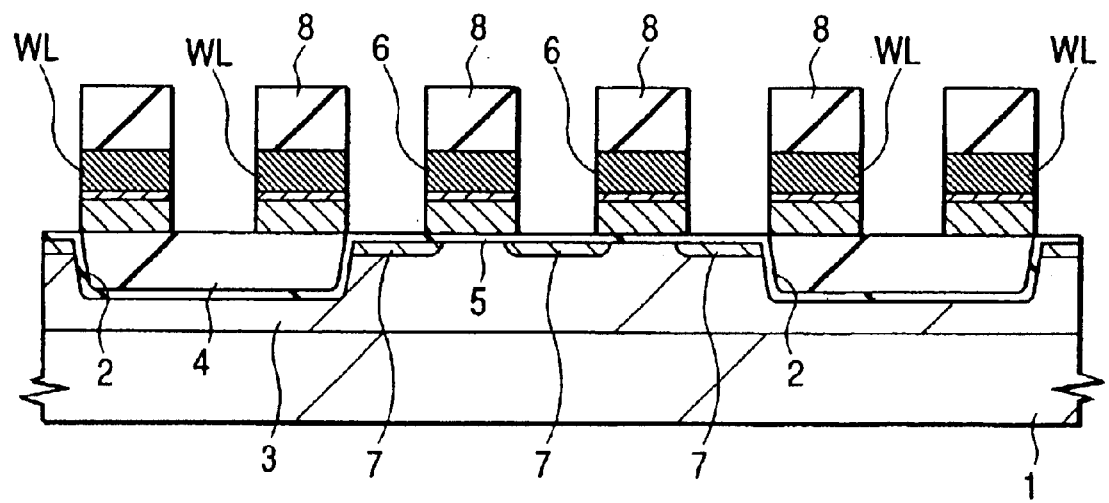
FIG. 2 is a sectional view of an essential part of a semiconductor substrate showing a mass production method of a semiconductor integrated circuit device according to the one embodiment of the invention.

As shown in FIG. 2, a gate electrode 6 (word line WL) is formed on the top of the gate oxide film 5, followed by formation of an n-type semiconductive region 7 of a low impurity concentration on the p-type well 3 at the opposite side of the gate electrode 6.

The gate electrode 6 (word line WL) is formed by depositing, on the substrate 1, a polysilicon film doped with an n-type impurity such as, for example, P according to a CVD method, depositing, on the top thereof, a WN (tungsten nitride) film and a W (tungsten) film by a sputtering method, further depositing a silicon nitride film 8 thereover by the CVD method, and dry etching these films by the mask of a photoresist film. The n-type semiconductive region 7 is formed by ion implantation of an n-type impurity such as, for example, arsenic (As).

Figure 3:
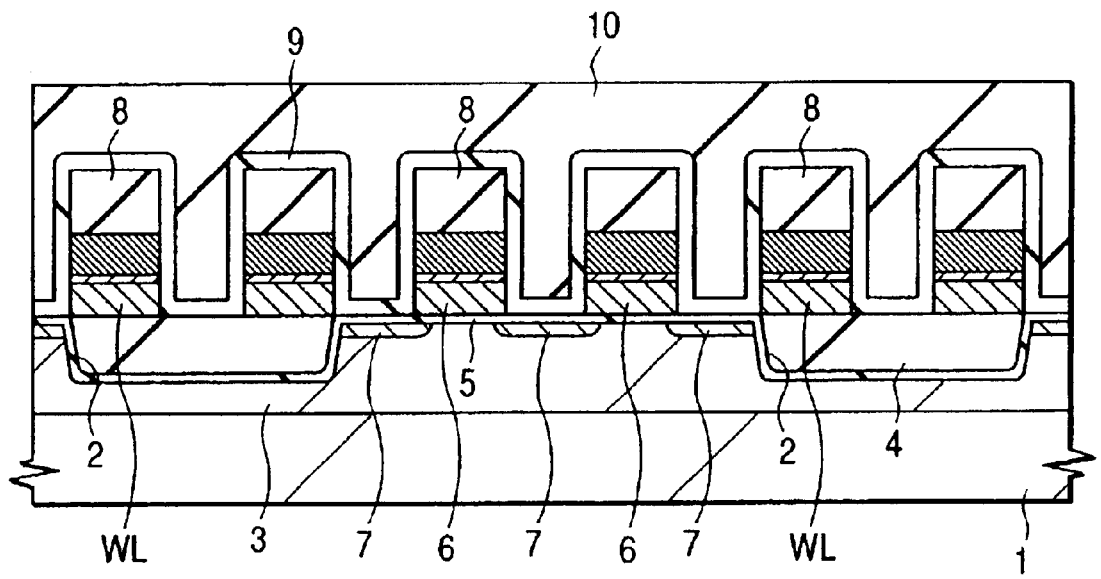
FIG. 3 is a sectional view of an essential part of a semiconductor substrate showing a mass production method of a semiconductor integrated circuit device according to the one embodiment of the invention.

Thereafter, as shown in FIG. 3, a silicon nitride film 9 and a silicon oxide film 10 are successively deposited over the substrate 1 by a CVD method, followed by planarization of the silicon oxide 10 on the surface thereof by a chemical mechanical polishing method.

Figure 4:
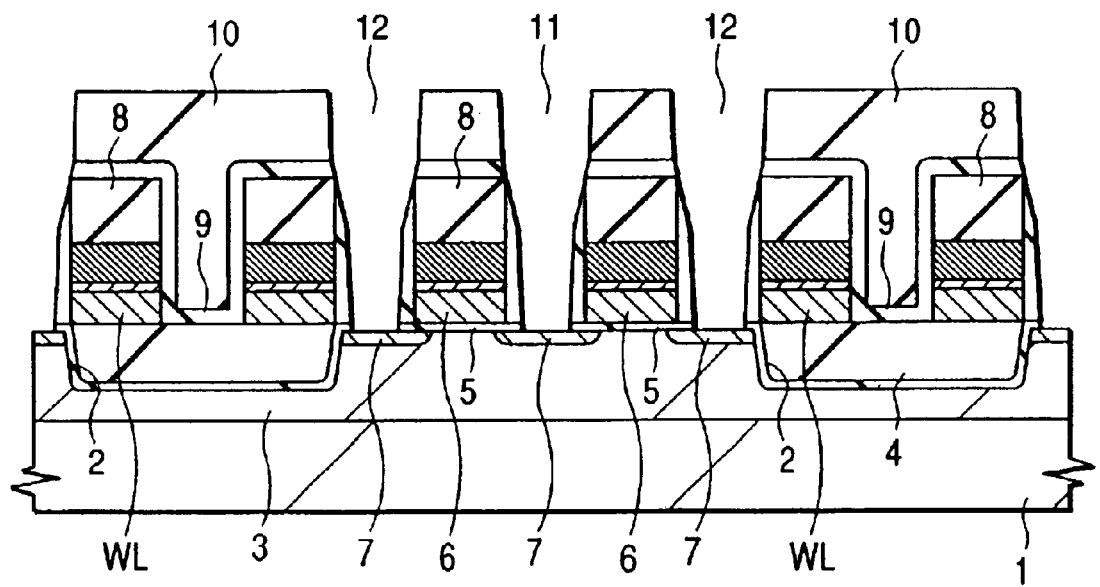
FIG. 4 is a sectional view of an essential part of a semiconductor substrate showing a mass production method of a semiconductor integrated circuit device according to the one embodiment of the invention.
Figure 5:
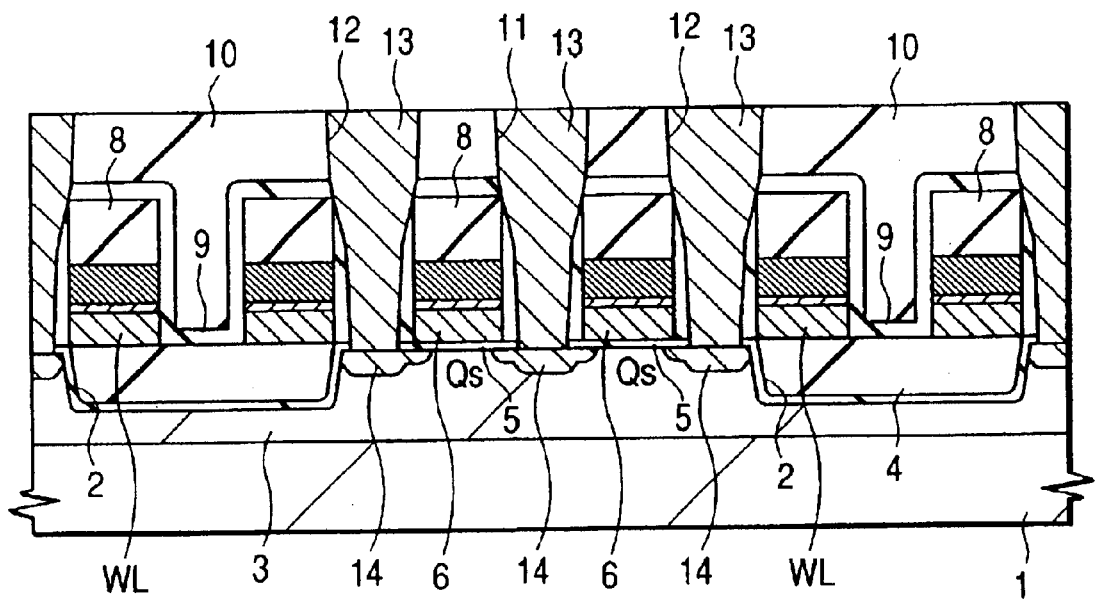
FIG. 5 is a sectional view of an essential part of a semiconductor substrate showing a mass production method of a semiconductor integrated circuit device according to the one embodiment of the invention.

Next, as shown in FIG. 4, using a photoresist film (not shown) as a mask, the silicon oxide film 10 and the silicon nitride film 9 above the semiconductive region 7 are dry etched to form contact holes 11, 12. Subsequently, as shown in FIG. 5, a plug 13 made of a polysilicon film is formed inside the contact holes 11, 12. The plug 13 is formed by depositing, for example, inside the contact holes 11, 12 and over the silicon oxide film 10, a polysilicon film doped with an n-type impurity such as P by a CVD method, after which the polysilicon film is removed from the top of the silicon oxide film 10 by a chemical mechanical polishing (or etching-back) method, and left inside the contact holes 11, 12.

Thereafter, the substrate is annealed (thermally treated) so that the n-type impurity in the polysilicon film serving as the plug 13 is diffused into the substrate 1 (n-type semiconductive region 7), thereby forming n-type semiconductive regions (source, drain) of a high impurity concentration. According to the steps set out hereinabove, MISFEQs of the n-channel type for memory cell selection, which constitute part of a memory cell of DRAM are completed.

Figure 6:
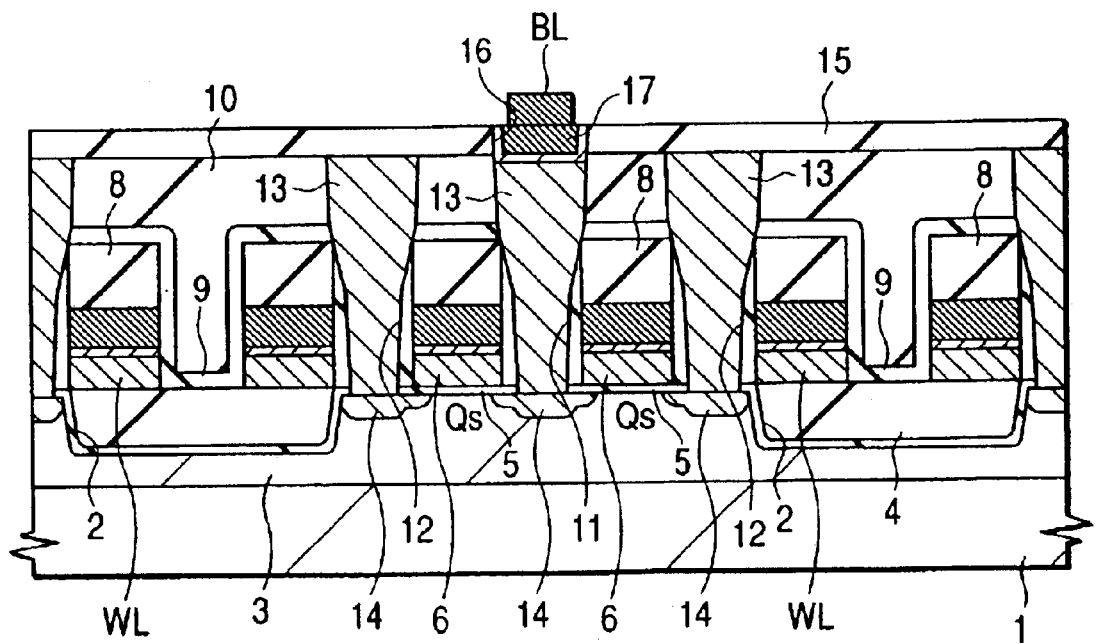
FIG. 6 is a sectional view of an essential part of a semiconductor substrate showing a mass production method of a semiconductor integrated circuit device according to the one embodiment of the invention.

Next, as shown in FIG. 6, a silicon oxide film 15 is deposited over the silicon oxide film 10 according to a CVD method, and the silicon oxide film 15 is subsequently dry etched to form a through-hole 16 above the contact hole 11, followed by forming a plug 17 inside the through-hole and further forming a bit line BL over the plug 17.

The plug 17 is formed by depositing a TiN (tungsten nitride film and a W film, for example, inside the through-hole 16 and above the silicon oxide film 15 by a CVD method or sputtering method, followed by removing the TiN film and W film on the silicon oxide film 15 by a chemical mechanical polishing method to leave them inside the through-hole 16. The bit line BL is formed, for example, by depositing a W film on the silicon oxide film 15 by a sputtering method and dry etching the W film through the mask of a photoresist film. The bit line BL is electrically connected to either (the n-type semiconductive region 14) of the source and drain of MISFETQs for memory selection through the plug 17 within the through-hole 16 and the plug 13 within the contact hole 11.

Figure 7:
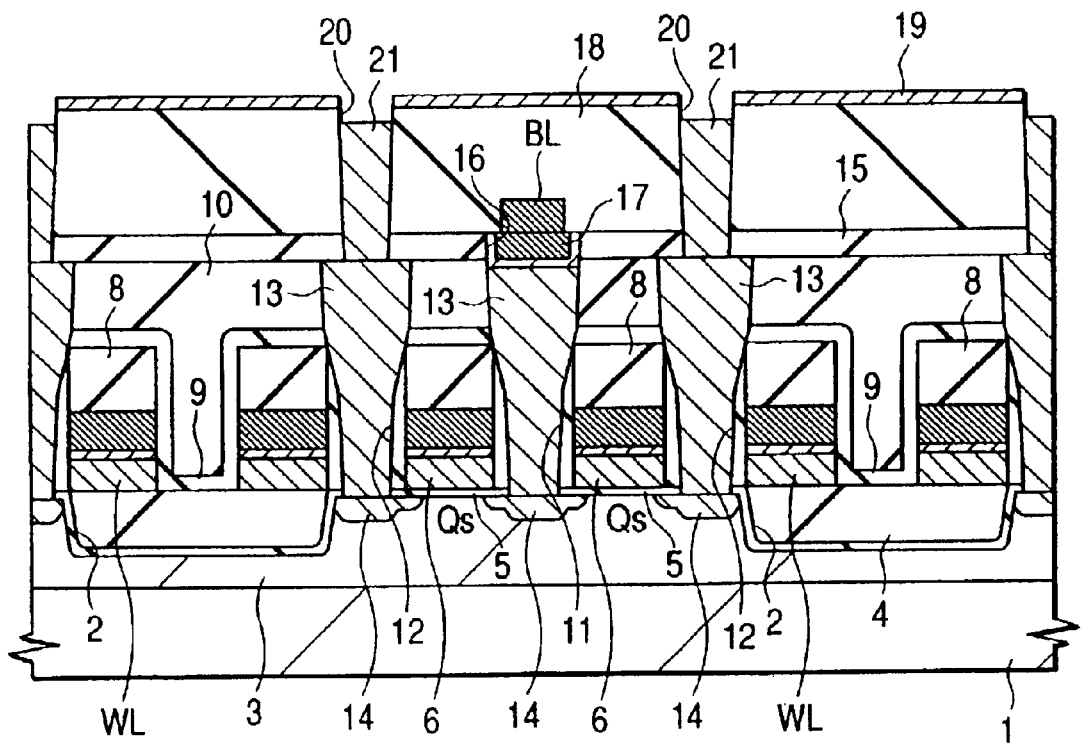
FIG. 7 is a sectional view of an essential part of a semiconductor substrate showing a mass production method of a semiconductor integrated circuit device according to the one embodiment of the invention.

Next, as shown in FIG. 7, a silicon oxide film 18 is deposited on the silicon oxide film 15 by a CVD method, and a TiN film 19 is further formed on the silicon oxide film 18 by a sputtering method, followed by dry etching of the TiN film 19 and the silicon oxide film 18 to form a through-hole 20 over the contact hole 12, followed by formation of a plug inside the through-hole 20. The plug 21 is formed, for example, by depositing a polysilicon film doped with an n-type impurity, such as P, inside the through-hole 20 and on the TiN film 19 by a CVD method, and the polysilicon film on the TiN film 19 is removed by an etching-back method to leave it inside the through-hole 20. At this time, the polysilicon film constituting the plug 21 is over-etched so that the surface of the plug 21 is recessed relative to the surface of the TiN film.

Figure 8:
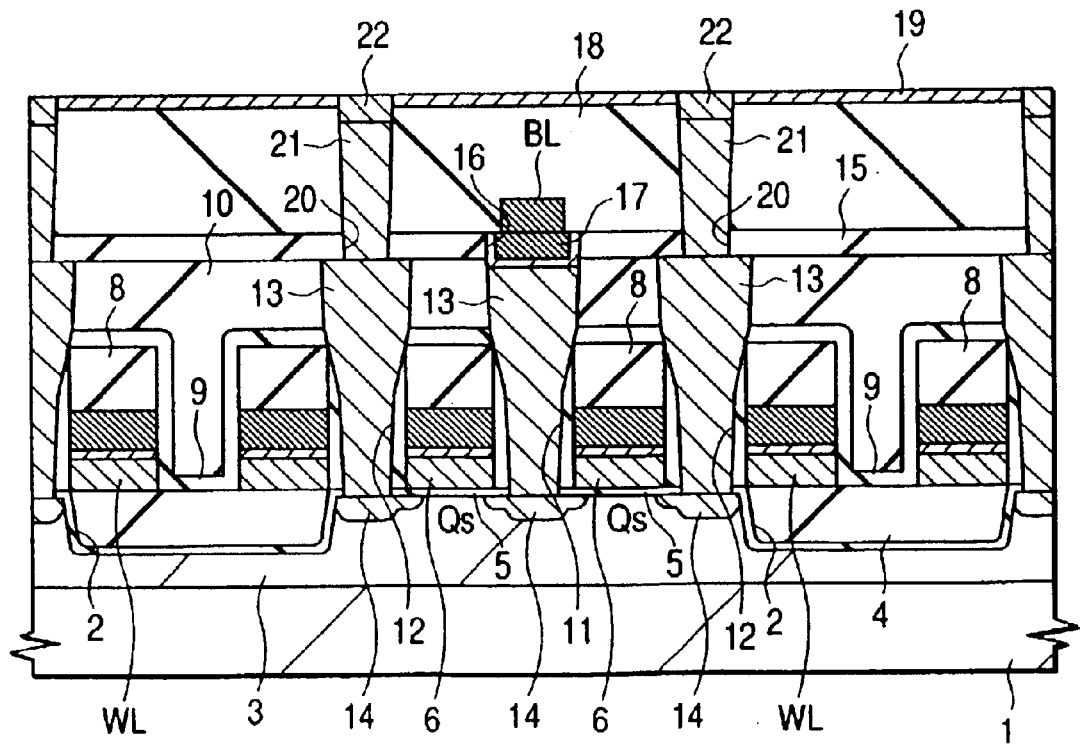
FIG. 8 is a sectional view of an essential part of a semiconductor substrate showing a mass production method of a semiconductor integrated circuit device according to the one embodiment of the invention.

Next, as shown in FIG. 8, a barrier metal 22 is formed on the plug 21. The barrier metal 22 is formed, for example, by depositing a WN film inside the through-hole 20 and on the TiN film 10 by a sputtering method, and the WN film on the TiN film is removed by a chemical mechanical polishing (or etching-back) method to leave the W film inside the through-hole 20.

The barrier metal on the plug 21 is formed for the purposes of preventing the reaction between a lower electrode material (Ru) of an information storage capacitor element deposited on the TiN film 19 in a subsequent step and the plug 21 (polysilicon film) and preventing oxidation of the plug 21 (polysilicon film) with oxygen present in a capacitance insulating film material (BST). The barrier metal 22 may be constituted, aside from WN, of TiN, TaN (tantalum nitride), TaSiN, WSiN, TiSiN or the like.

Figure 9:
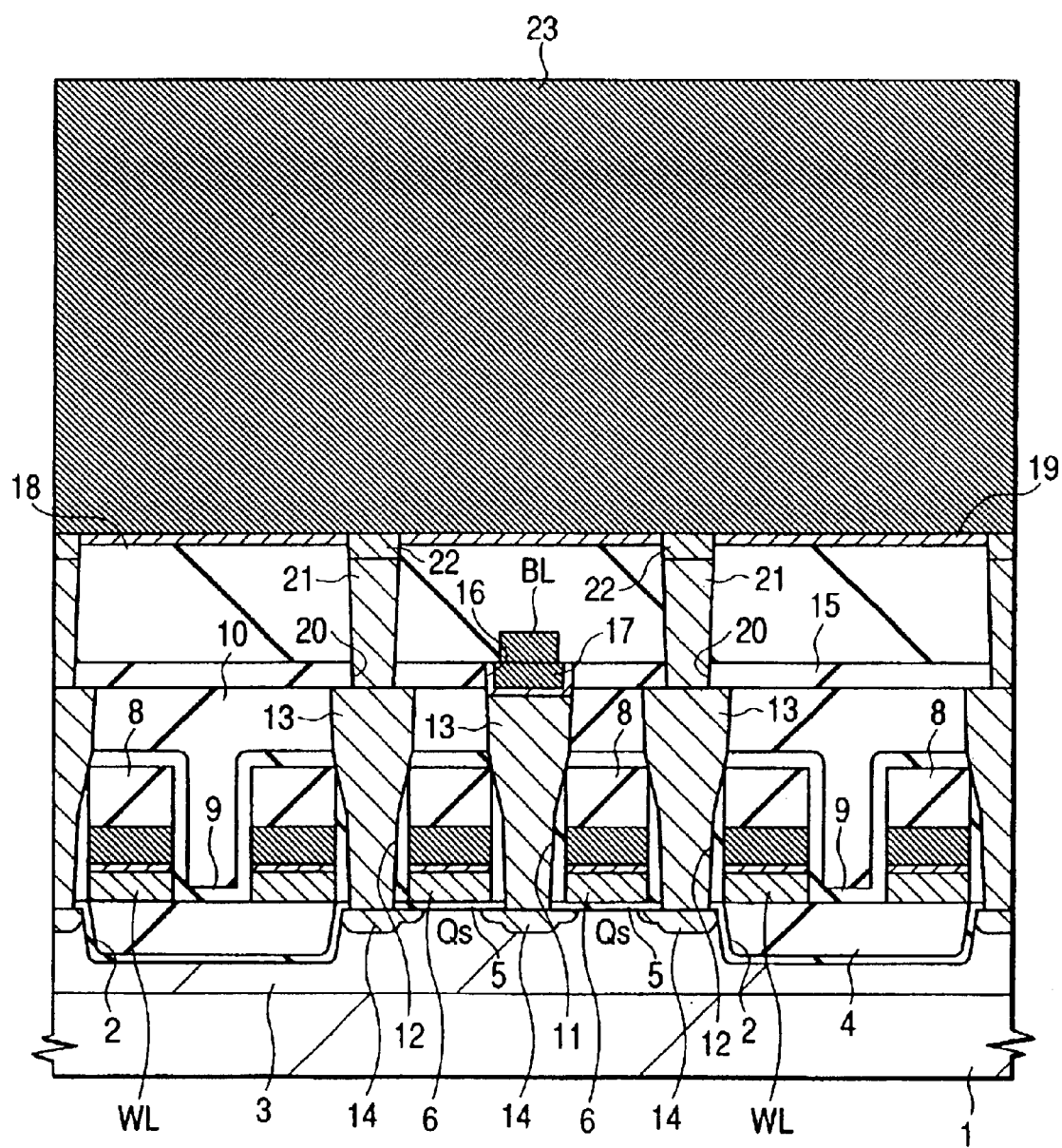
FIG. 9 is a sectional view of an essential part of a semiconductor substrate showing a mass production method of a semiconductor integrated circuit device according to the one embodiment of the invention.

As shown in FIG. 9, a Ru film serving as a lower electrode of an information storage capacitor element is deposited on the TiN film by a sputtering method.

Figure 10:
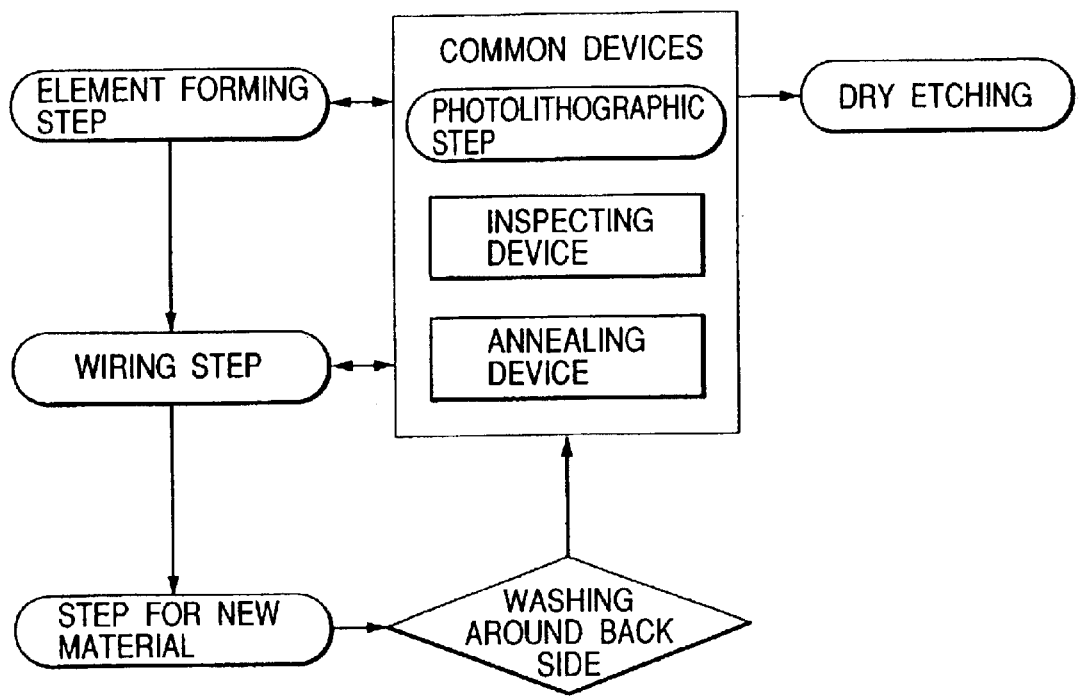
FIG. 10 is a view illustrating a concept of common use of a lithographic step in a mass production process of a semiconductor integrated circuit device.

In the production process of general-purpose LSI such as DRAM, lithographic devices (a light exposure device and an EB exposure device), various inspection devices, an annealing (thermal treating) device and the like are commonly used for the initial element formation step and wiring step prior to the formation of a gate insulating film in order to suppress a facility investment to a minimum and reduce the production cost, as is particularly shown in FIG. 10. In the formation of an information storage capacitor element wherein transition metals or material containing the metals, such as the Ru film 23 and a BST film described hereinafter, which have never been used in prior art wafer processes, there common use devices are employed. Accordingly, the wafer (substrate) 1, on which the Ru film 23 or the BST film has been deposited, is transferred from a device, after which the wafer 1 is transferred to the common use devices for carrying out an initial element formation step or wiring step. The term "wiring step" used herein means the step of forming the gate electrode 6 and the bit line BL shown in FIGS. 2 to 8 and the step of forming wirings on an information storage capacitor element described hereinafter.

Figure 11:
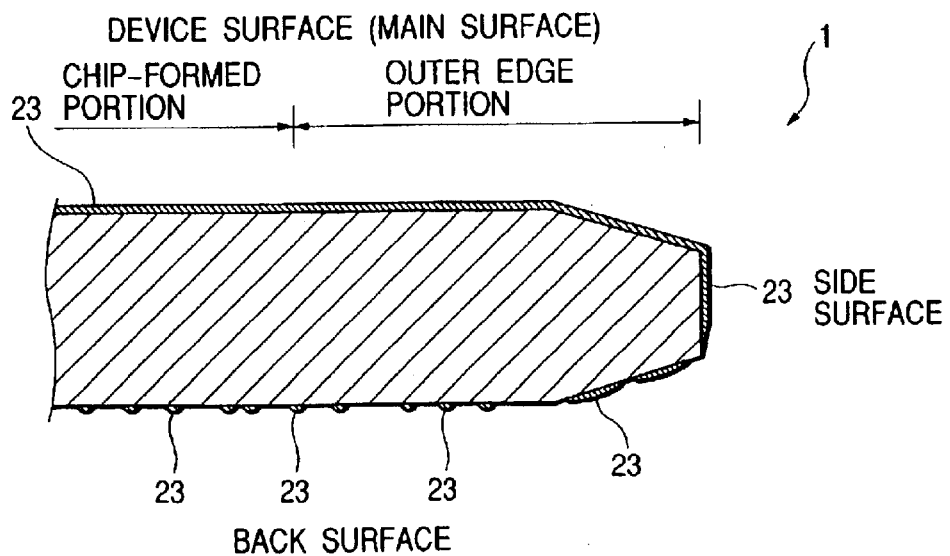
FIG. 11 is a sectional view showing a peripheral portion of a wafer on which an Ru film is deposited.

FIG. 11 is a sectional view showing a peripheral portion of the wafer 1 on which the Ru film is deposited. As shown, the Ru film 23 is deposited on the device side (main surface) of the wafer (substrate) 1 by a sputtering method, whereupon the Ru film 23 is deposited not only on a chip formation portion on the device side and an outer edge portion, but also on a side surface (edge portion). Part of the film is deposited on the back side of the wafer 1. In this condition, when the wafer 1 is transferred to the common use devices without satisfactory removal of the Ru film from the side surface and the back side thereof, a wafer stage, wafer carrier, conveyor and the like, which come into contact with the side surface and the back side, are attached with the Ru film 23 on the surfaces thereof. This results in the contamination, with Ru, of the wafers 1 of the lower layers steps (including the initial element formation step and wiring step prior to the gate insulating film formation step, which are subsequently fed to the common use devices).

In this embodiment, prior to the step of forming a lower electrode after transfer of the wafer, on which the Ru film 23 is deposited, to the common use devices, the unnecessary Ru film 23 deposited on the side surface and the backside of the wafer 1 is removed in the following way.

Figure 12:
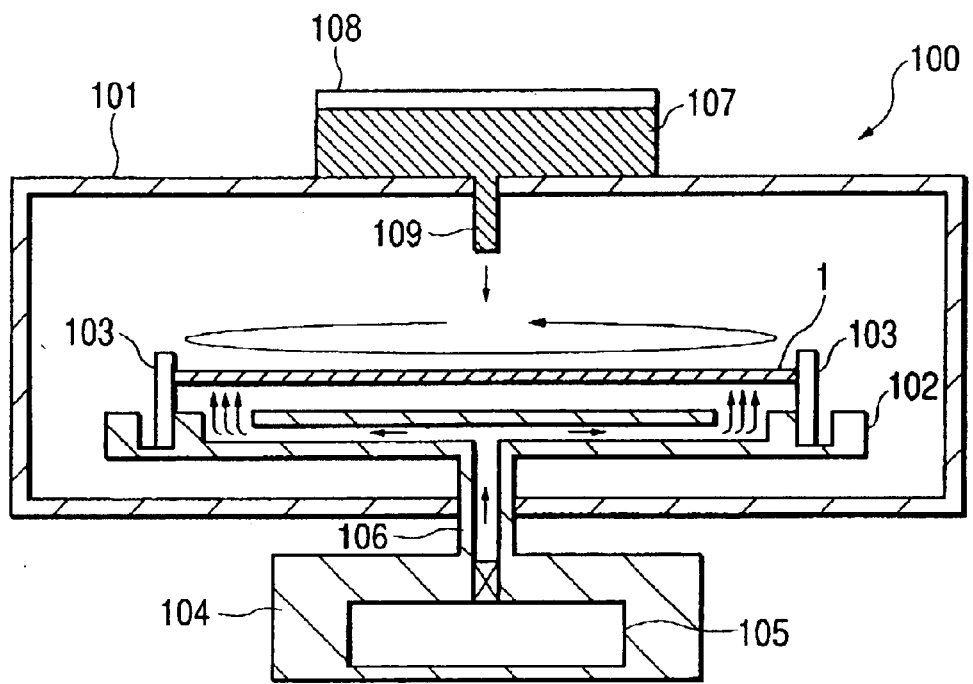
FIG. 12 is a schematic sectional view showing an example of a cleaning device used in the one embodiment of the invention.
Figure 13:
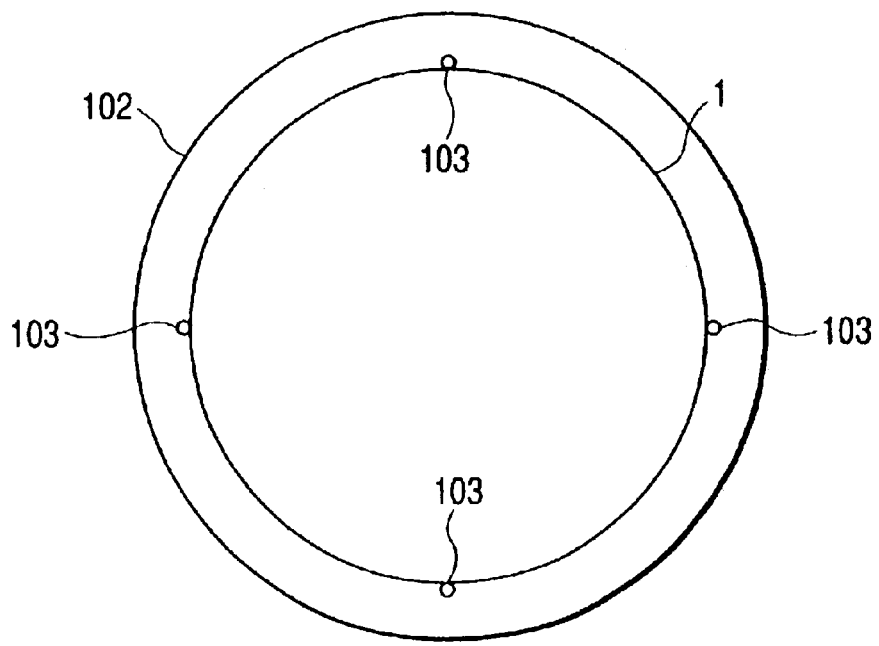
FIG. 13 is a plan view showing the stage of the cleaning device shown in FIG. 12.

FIG. 12 is a schematic sectional view showing an example of a cleaning device used to remove the Ru film 23 deposited on the side surface and the back side of the wafer 1, and FIG. 13 is a plan view showing the stage of the cleaning device.

A cleaning device 100 includes a treating chamber 101 having a stage 102, on which the wafer 1 is mounted, at a central portion thereof. The stage 102 has, on the upper surface thereof, four pins 103 which are in contact with the side surfaces of the wafer 1 and are located at equal intervals. These pins 103 are arranged to be rotated thereabout within a horizontal plane. The wafer 1 is horizontally held in such a state that its back side is turned upwardly by urging the pins 103 against the wafer. The wafer 1 supported with the pins 103 is in a non-contact state with the stage 102 except for the four side surfaces in contact with the individual pins 103.

There are provided, below the treating chamber 101, a drive unit 104 capable of rotating the stage 102 within the horizontal plane and a gas feed unit 105 filled with an inert gas such as nitrogen. The nitrogen gas in the gas feed unit 105 is supplied to the upper surface of the stage 102 through a pipe 106 below the stage 102.

Figures 14, 15:
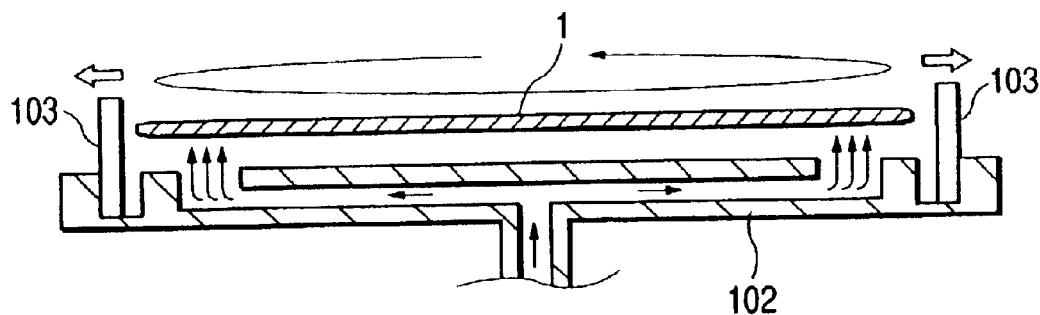
FIG. 14 is a schematic sectional view showing a method of holding a wafer in the cleaning device-shown in FIG. 12.
FIG. 15 is a table showing the etching rate of Ru depending on different types of cleaning solutions used in a semiconductor production process.

As shown in FIG. 14, the four pins 103 arranged above the stage 102 can be, respectively, moved horizontally in a direction kept away from the wafer. When the wafer 1 is held with the four pins 104, these pins 103 have been preliminarily moved at positions remote from the wafer 1, under which the nitrogen gas is fed against the lower surface of the wafer 1 to permit the wafer to be floated. In this state, the pins 103 are urged against the side surfaces of the wafer 1.

A cleaning vessel 108 is provided above the stage 102. A cleaning solution 107 is charged into the cleaning vessel 103 for removing the Ru film 23 deposited on the side surface and the back side of the wafer 1. The cleaning solution is applied to the upper surface (back side) of the wafer 1 through a nozzle 109, so that the back side and the side surface of the wafer 1, which is rotated while holding with the pins 103, are cleaned. When the rotation speed of the stage 102 is appropriately controlled, the cleaning solution 107 can be spread toward the outer edge portion at the lower surface (device side) of the wafer 1.

Next, the composition of the cleaning solution 107 is illustrated. First, the etching rates of Ru with different types of cleaning solutions used in a semiconductor production process are shown in FIG. 15. A sample used was a 3 cm×4 cm square silicon chip on which a 100 nm thick Ru film has been deposited, and the thickness of the Ru film etched per unit minute was measured. As shown in the figure, the etching rate of Ru was 0.1 nm/minute or below for all the cleaning solutions. It will be noted that the rate of 0.1 nm/minute is a limit value of the measurement of the device used. From the results, it will be seen that the known cleaning solutions used in the semi-conductor production process do not enable Ru to be removed.

Then, the dissolving mechanism of Ru is described. In order to remove the Ru film 23, it is necessary to use chemicals capable of dissolving Ru. For the dissolution of Ru, it is also necessary to oxidize Ru. The oxidation reaction of Ru proceeds according to the following formulas:

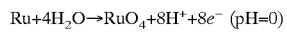

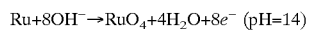

The oxidation reduction potential (E) necessary for the reaction is at 1.13 V for an acidic aqueous solution (pH=0) and at 0.30 V for an alkaline aqueous solution (pH=14). Accordingly, for the oxidation of Ru, it is necessary to use an oxidizing agent whose oxidation reduction potential is at a level of 1.13 V or over in an acidic aqueous solution and is at 0.30 V or over in an alkaline aqueous solution.

FIG. 16 shows etching rates of Ru at predetermined concentrations of different types of oxidizing agents (except iodine) having oxidation reduction potentials larger than the above-mentioned values. It will be noted that the sample used and the measurement of the etching rate are the same as in FIG. 15.

As shown, an oxidizing agent showing a great etching rate in an acidic condition is only orthoperiodic acid ($H_5IO_6$). On the other hand, oxidizing agents having a great etching rate in an alkaline condition include three compounds such as hypochlorous acid, metaperiodic acid and orthoperiodic acid. However, among the oxidizing agents showing a great etching rate in an alkaline condition, hypochlorous acid and metaperiodic acid are available in the form of a salt with an alkali metal such as sodium (Na). Thus, these cannot be employed in the semiconductor production process wherein contamination with an alkali metal is not favored. Accordingly, the oxidizing agent, which can be used as the cleaning solution 107 for the Ru film among these oxidizing agents, is substantially orthoperiodic acid alone. The advantage of the oxidizing agent used in an acidic condition is that any salt with a solute is not formed, unlike an oxidizing agent used in an alkaline condition.

Figure 17:
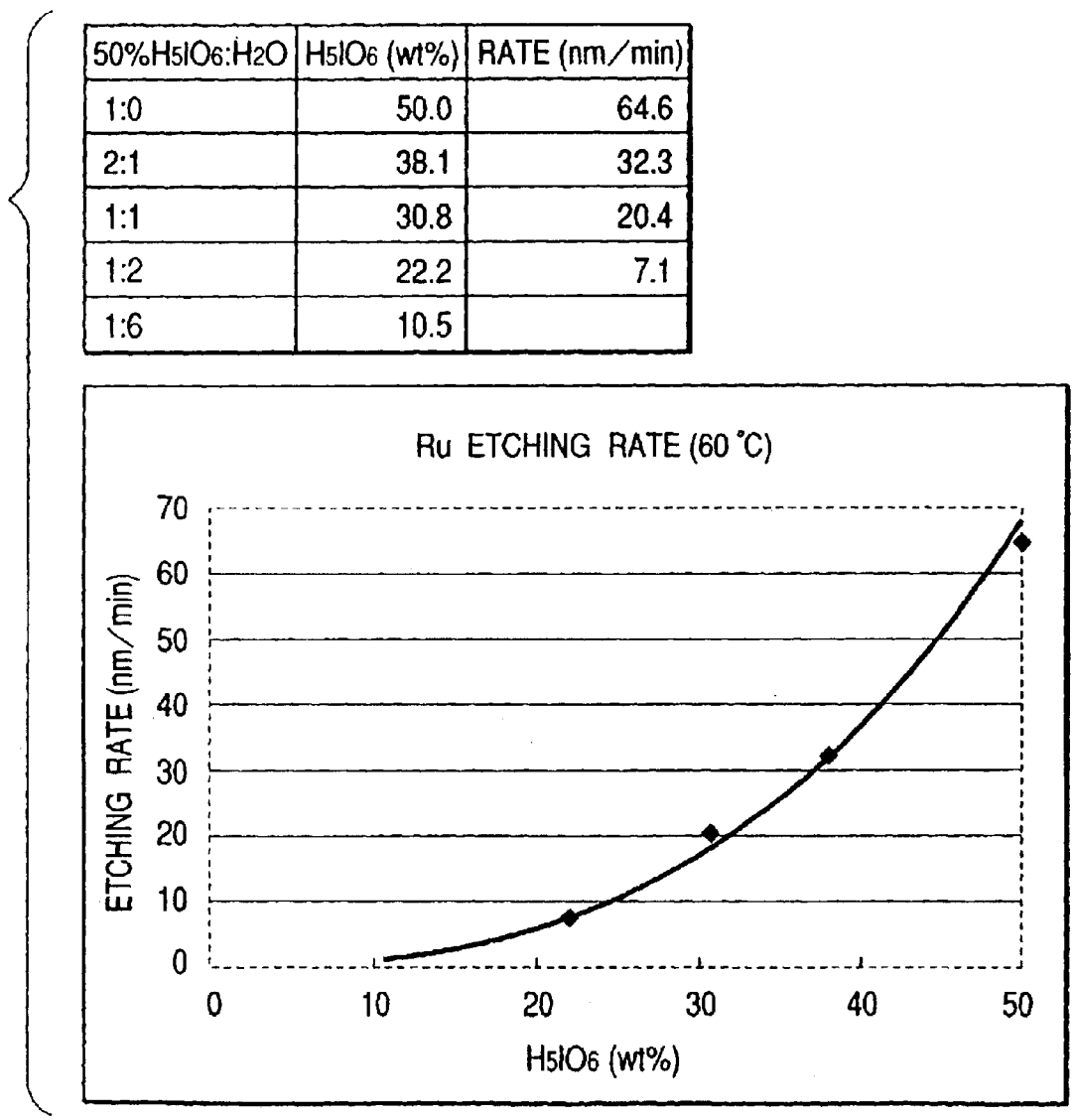
FIG. 17 is a table and a graph showing the relation between the concentration of an orthoperiodic acid aqueous solution and the etching rate of Ru.

FIG. 17 is a graph showing the relation between the concentration of an orthoperiodic acid aqueous solution (60° C.) and the etching rate (nm/minute) of Ru. As shown, it will be seen that when the concentration of orthoperiodic acid in the aqueous solution is at about 10 wt % or over, the etching rate of Ru increases approximately in proportion to the concentration of orthoperiodic acid. Accordingly, where an orthoperiodic acid aqueous solution is used as the cleaning solution 107 of the Ru film 23, the concentration of orthoperiodic acid may be within a range of about 10 wt % to a saturation.

Further, we have found that when nitric acid is mixed with the orthoperiodic acid aqueous solution, the etching rate of Ru further increases.

Figure 18:
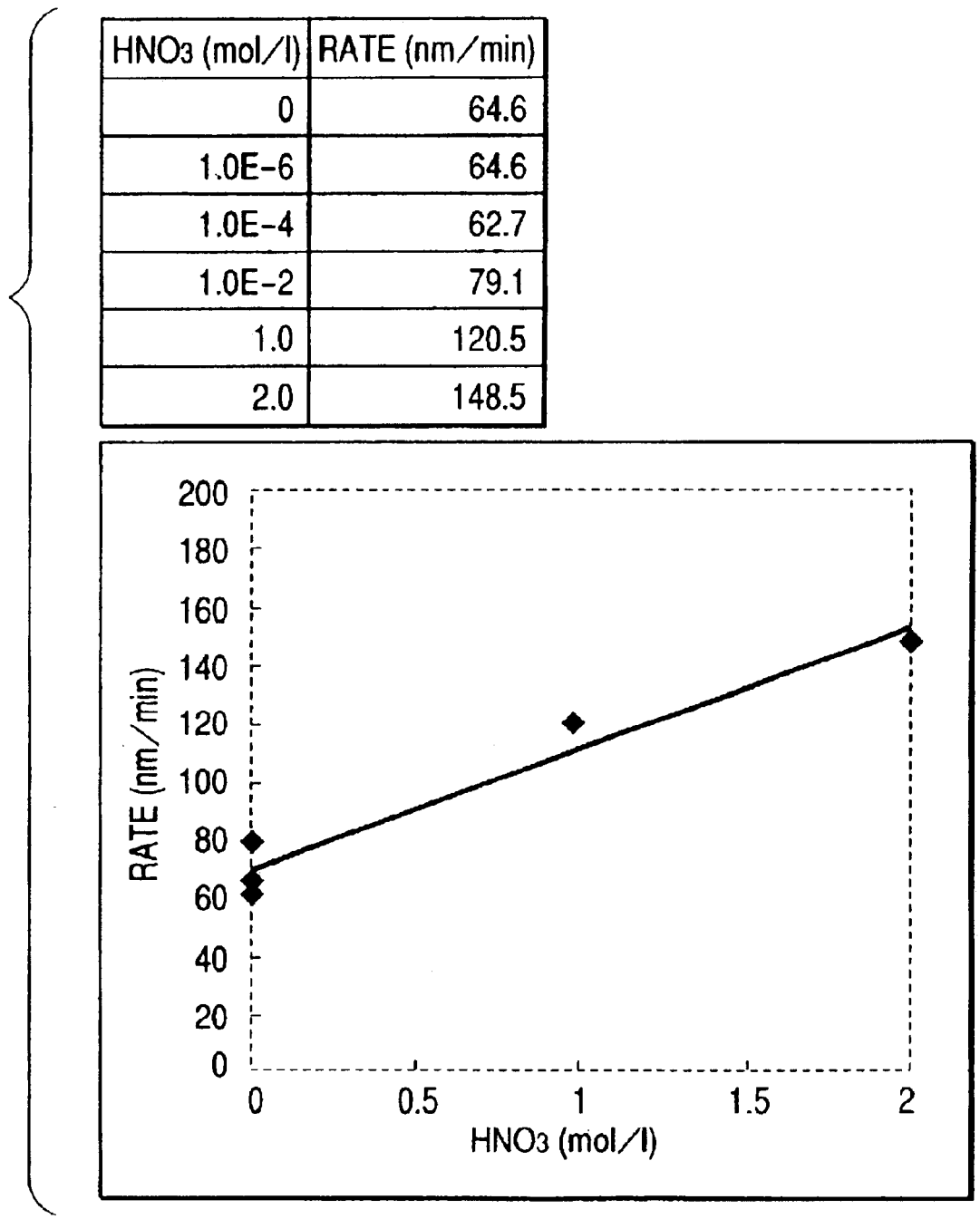
FIG. 18 is a table and a graph showing the relation between the concentration of nitric acid and the etching rate when Ru is etched by use of an orthoperiodic acid aqueous solution to which nitric acid is added.

FIG. 18 is a graph showing the relation between the concentration of nitric acid and the etching rate when Ru is etched by use of an aqueous solution (temperature of 60° C.) obtained by adding nitric acid to an orthoperiodic acid aqueous solution having a concentration of 47 wt % (wherein a sample is the same as used in FIG. 15) As shown, when the concentration of nitric acid is within a range of up to 2 mols/l, the etching rate increases substantially in proportion to the amount of nitric acid.

FIGS. 19(a) to 19(d) are, respectively, tables showing the relation between the mixing ratio of nitric acid and the etching rate when etching Ru with aqueous solutions (temperature of 60° C.) obtained by adding a nitric acid aqueous solution with a concentration of 69 wt % at ratios of 0 (not added), 1, 2, 5 and 10 relative to 10 of orthoperiodic acid aqueous solutions having four concentrations (of 20 wt %, 30 wt %, 40 wt % and 50 wt %) (the sample is the same as that used in FIG. 15). In all the cases, the addition of nitric acid results in a significant increase in etching rate of Ru in comparison with the case using orthoperiodic acid singly.

FIG. 20 is a graph showing the etching rate of Ru as a contour wherein the concentrations of orthoperiodic acid and nitric acid in FIG. 19 are re-calculated as percent by weight. As shown, the aqueous solutions having a concentration of orthoperiodic acid of 20 wt % to 40 wt % and a concentration of nitric acid of 20 wt % to 40 wt % exhibit a reduced variation in the etching rate of Ru. Especially, it will be seen that the aqueous solutions having a concentration of orthoperiodic acid of 25 wt % to 35 wt % and a concentration of nitric acid of 25 wt % to 35 wt %, indicated by broken lines in the figure, have a variation in the etching rate of Ru as small as about 10%.

From the above, where an aqueous solution containing orthoperiodic acid and nitric acid is used as the cleaning solution 107 of the Ru film 23, the concentrations of orthoperiodic acid and nitric acid are, respectively, within a range of 20 wt % to 40 wt %, preferably 25 wt % to 35 wt %, within which the variation in etching rate of Ru depending on the variation in concentration of the cleaning solution 107 can be suppressed, thus enabling one to take a wide process margin. More particularly, a mixed aqueous solution of orthoperiodic acid+nitric acid within the above-defined concentration ranges is used as a cleaning solution suitable for the mass production process wherein a large number of wafers are continuously processed.

The reason why mixing of nitric acid with an orthoperiodic acid aqueous solution results in the increase of the etching rate of Ru is assumed as follows. More particularly, orthoperiodic acid ($H_5IO_6$) is in an ionization equilibrium in an aqueous solution as shown by the following formulas.

$H_5IO_6 \Leftrightarrow H_4IO_6^- + H^+$ $H_4IO_6^- \Leftrightarrow H_3IO_6^{2-} + H^+$ $H_3IO_6^{2-} \Leftrightarrow H_2IO_6^{3-} + H^+$ $H_4IO_6^- \Leftrightarrow IO_4^- + H_2O$ $2H_3IO_6^{2-} \Leftrightarrow H_2I_2O_{10}^{4-} + 2H_2O$ Of these molecules and ionic species contained in the aqueous solution, one that has the capability of oxidizing Ru is only orthoperiodic acid ($H_5IO_6$) alone. When nitric acid is added to the orthoperiodic acid aqueous solution, the concentration of the proton ($H^+$) derived from nitric acid increases in the aqueous solution, so that the above equilibrium proceeds toward the left side. Eventually, the concentration of orthoperiodic acid ($H_5IO_6$) capable of oxidizing Ru becomes high, from which it is assumed that the etching rate of Ru increases.

Accordingly, the addition of an acid other than nitric acid and capable of permitting the equilibrium to proceed to the left side enables the etching rate of Ru to be increased. For instance, FIG. 21 shows the variation in etching rate of Ru when different types of commercially available acids are, respectively, added to an orthoperiodic acid aqueous solution. As shown, the etching rate of Ru increases when adding, aside from nitric acid, acetic acid.

Examples of the acid capable of increasing the etching rate of Ru includes: carboxylic acids, typical of which are the above-indicated acetic acid and HCOOH (formic acid);

hydrohalogenic acids such as HF (hydrofluoric acid), HBr (hydrobromic acid), HI (hydroiodic acid) and the like;

halogenated oxo acids such as $HClO_3$ (chloric acid), $HClO_4$ (perchloric acid), $HBrO_3$ (bromic acid), $HBrO_4$ (perbromic acid) and the like;

$H_2S$ (hydrogen sulfide), hydrogen polysulfides such as $H_2S_3$, $H_2S_4$ and the like, hydrides of elements of group 6 such as $H_2Se$ (hydrogen selenide), $H_2Te$ (hydrogen telluride) and the like;

oxo acids of sulfur such as $H_2S_2O_3$ (thiosulfuric acid), $H_2S_2O_7$ (disulfuric acid), $H_2SO_6$ (polythionic acid), $H_2SO_5$ (peroxosulfuric acid), $H_2S_2O_8$ (peroxodisulfuric acid) and the like;

$H_2SeO_4$ (selenic acid), $H_6TeO_6$ (telluric acid) and the like;

polyphosphoric acids such as $H_3PO_4$ (orthophosphoric acid), $H_4P_2O_7$ (pyrophosphoric acid), $H_5P_3O_{10}$ (triphosphoric acid), $H_6P_4O_{13}$ (tetraphosphoric acid) and the like, and oxoacids of phosphorus, typical of which is $(HPO_3)_n$ (cyclo-phosphoric acid); and $H_3AsO_4$ (arsenic acid), $HN_3$ (hydrogen azide), $H_2CO_3$ (carbonic acid), $H_3BO_3$ (boric acid) and the like.

Next, the cleaning method using the cleaning solution 107 made of an orthoperiodic acid aqueous solution or aqueous solutions mixed with different types of acids indicated above is described with reference to FIGS. 12 to 14.

Initially, the wafer 1 deposited thereon with the Ru film 23 is transferred into the treating chamber of the cleaning device 100 wherein nitrogen gas is fed toward the upper surface of the stage 102 from the gas feed unit 105 thereby causing the wafer to be floated (FIG. 14). Next, the pins 103 are pressed against the side surfaces of the wafer 1 to hold the wafer 1 horizontally (FIGS. 12, 13).

Subsequently, while rotating the stage 102, the cleaning solution 107 is supplied from the cleaning vessel 108 through a nozzle 109 toward the upper surface (back side) of the wafer 1, thereby cleaning the back side and the side surface of the wafer 1. If necessary, the outer edge portion at the lower surface (device side) of the wafer 1 is also cleaned. The cleaning solution 107 used may be a mixed aqueous solution made, for example, of orthoperiodic acid (concentration of 30 wt %) and nitric acid (concentration of 30 wt %), both heated to 60° C.

During the course of the cleaning, the pins 103 in contact with the wafer 1 are each rotated within a horizontal plane. In this way, the wafer 1 is rotated by the frictional force with the pins 103, so that the side portions in contact with the pins 103 are changed to clean the entire side surfaces of the wafer 1. It will be noted that the cleaning device used herein is described in detail in our Japanese Patent Application No. Hei 11-117690.

The cleaning of the back side and the side surface of the wafer 1 using the cleaning solution 107 of this embodiment may be carried out by use of a device other than the above-stated cleaning device 100, e.g. the known Bernoulli chuck-type pin etching device. Prior to the cleaning of this embodiment, the back side of the wafer 1 may be subjected to brush cleaning.

The etching rate of the Ru film 23 with the above-mentioned mixed aqueous solution of orthoperiodic acid+nitric acid (60° C.) was found to be $2.244 \times 10^{-3}$ g/minute on the weight basis. In contrast, the etching rate of Ru with a solution (100° C.) of 33% $HIO_3$:20% ICI=1:1 in the case of the afore-referenced Japanese Laid-open Patent Application No. Hei 7-157832 was at $1.567 \times 10^{-6}$ g/minute, or the etching rate of Ru with a solution (70° C.) of 37% HI+0.01 mol/liter of 12 in the case of the afore-referenced Japanese Laid-open Patent Application No. Hei 7-224333 was at $0.9625 \times 10^{-6}$ g/minute, thus both being very small. Quantitatively it may be said that Ru is not substantially dissolved. More particularly, according to the method of the invention, Ru can be dissolved at an etching rate as high as not less than 1000 times that of these prior art techniques. In addition, the method of the invention is advantageous in that Ru can be dissolved at a temperature lower than in solutions of the prior art techniques.

Next, the method of forming a lower electrode using the Ru film 23 as an electrode material is described. First, the wafer 1, obtained after completion of the cleaning treatment, is transferred to an inspection device for common use shown in FIG. 10, in which the degree of contamination at the back side and the side surface is checked. Thereafter, the wafer 1 is annealed (thermally treated) in an atmosphere of nitrogen at about 700° C. by use of a common use annealing (thermal treating) device, thereby causing the stress of the Ru film 23 to be released.

Figure 22:
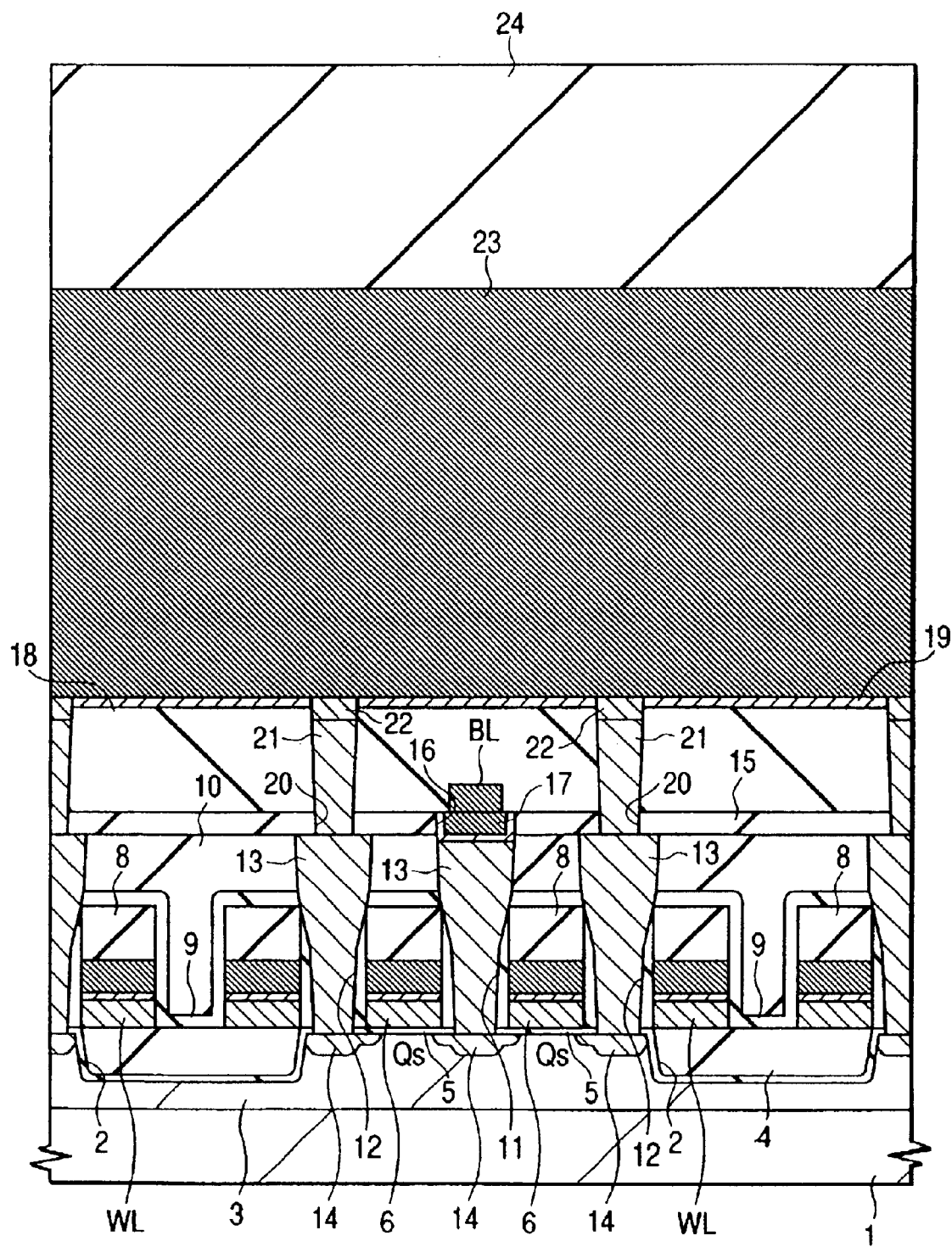
FIG. 22 is a sectional view of an essential part of a semiconductor substrate showing a mass production method of a semiconductor integrated circuit device according to the one embodiment of the invention.

Thereafter, the wafer 1 is transferred to a CVD device (not shown), and a silicon oxide film 24 is deposited on the Ru film 23 as shown in FIG. 22. For the dry etching of the Ru film 23, an oxygen-based gas is used, so that an oxidation-resistant material, such as the silicon oxide film 24, is used as an etching mask.

Figure 23:
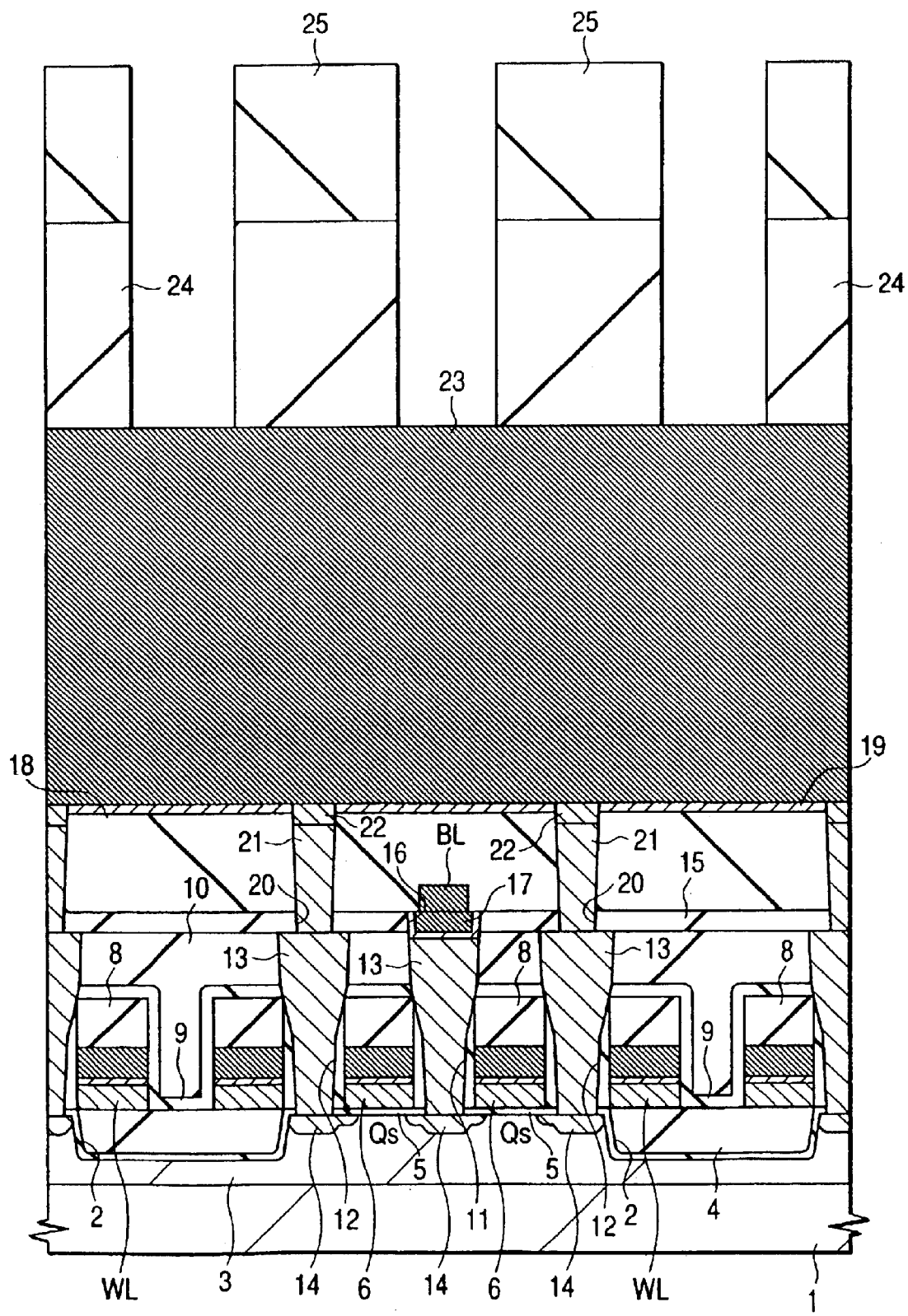
FIG. 23 is a sectional view of an essential part of a semiconductor substrate showing a mass production method of a semiconductor integrated circuit device according to the one embodiment of the invention.

Next, the wafer 1 is subjected to a lithographic step using the common use devices shown in FIG. 10. More particularly, as shown in FIG. 23, the silicon oxide film 24 is dry etched through the mask of a photoresist film 24 deposited on the silicon oxide film 24, thereby forming a hard mask for dry etching the Ru film 23.

Figure 24:
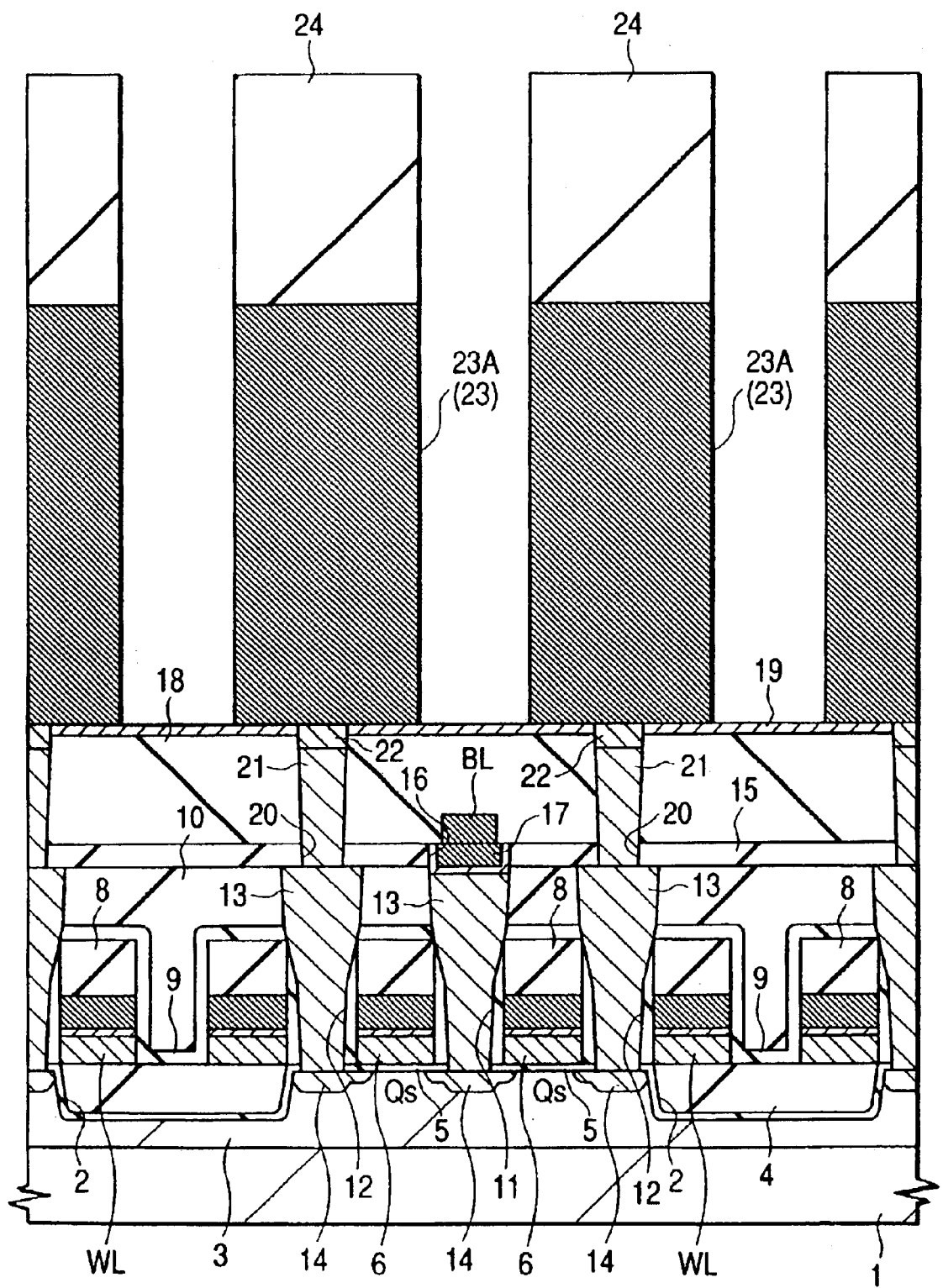
FIG. 24 is a sectional view of an essential part of a semiconductor substrate showing a mass production method of a semiconductor integrated circuit device according to the one embodiment of the invention.

The photoresist film 25 is removed by ashing, after which, as shown in FIG. 24, the Ru film 23 is dry etched through the mask of the silicon oxide film 24 to form a lower electrode 23A of an information storage capacitor element. For the etching of the Ru film 23, a mixed gas, for example, of oxygen gas and chlorine gas is used. The etching system used includes an inductively coupled plasma etching system, an ECR (electron cyclotron resonance) plasma etching system, an ICP (inductively coupled plasma) etching system, a magnetron RIE (reactive ion etching) plasma etching system, a helicon plasma etching system or the like. The Ru film 23 is etched by use of the lower TiN film 19 as an etching stopper while monitoring light with a wavelength of 406 nm, which is, for example, an emission peak of Ti.

In order to remove the etching residue of the Ru film 23, the wafer 1 is cleaned by use of the cleaning device shown in FIGS. 12 to 14. To this end, such a mixed aqueous solution of orthoperiodic acid+nitric acid as set out before is used as a cleaning solution, thereby permitting the Ru residue to be satisfactorily removed from the side surface and back side of the wafer 1.

Figure 25:
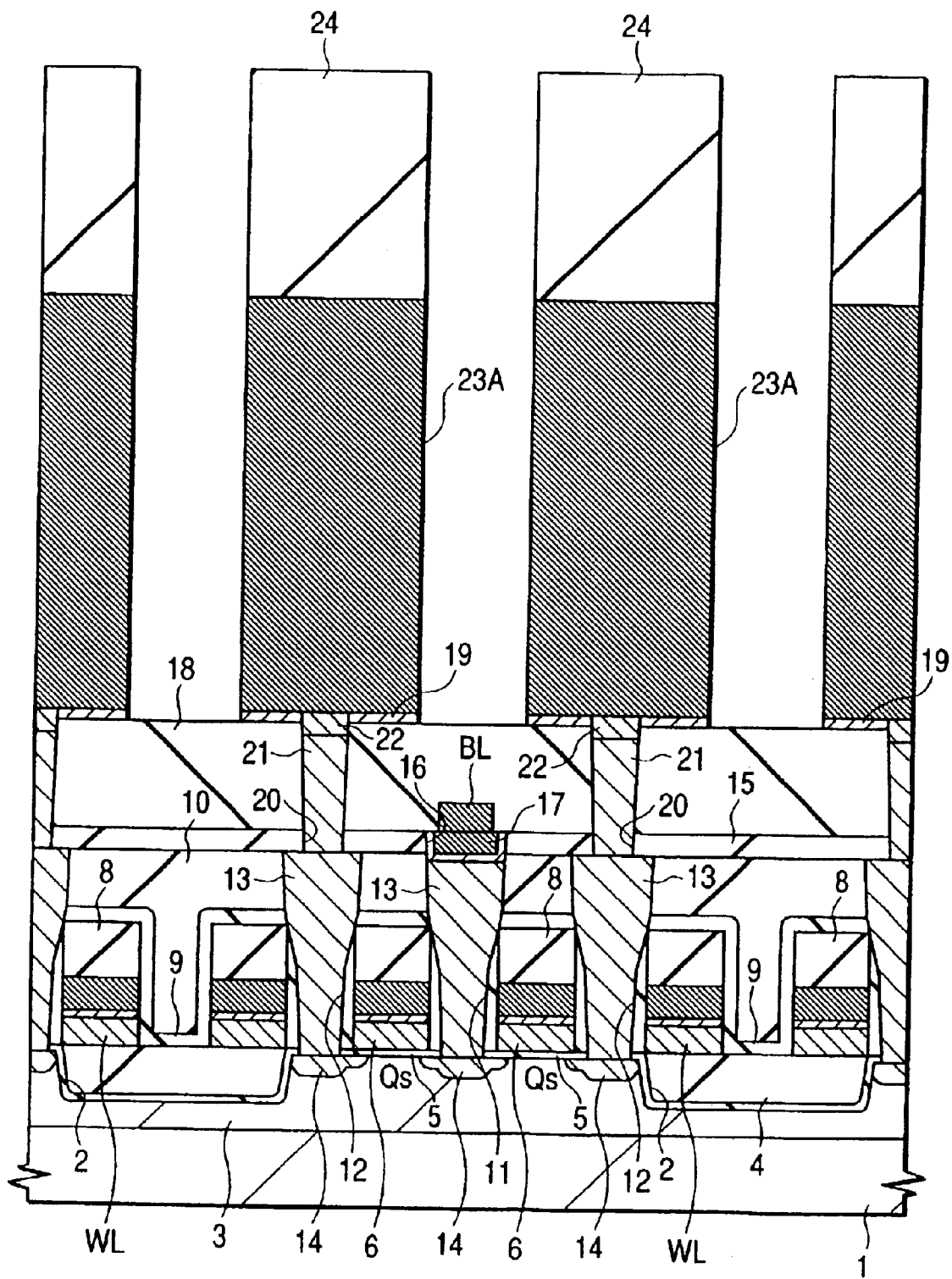
FIG. 25 is a sectional view of an essential part of a semiconductor substrate showing a mass production method of a semiconductor integrated circuit device according to the one embodiment of the invention.
Figure 26:
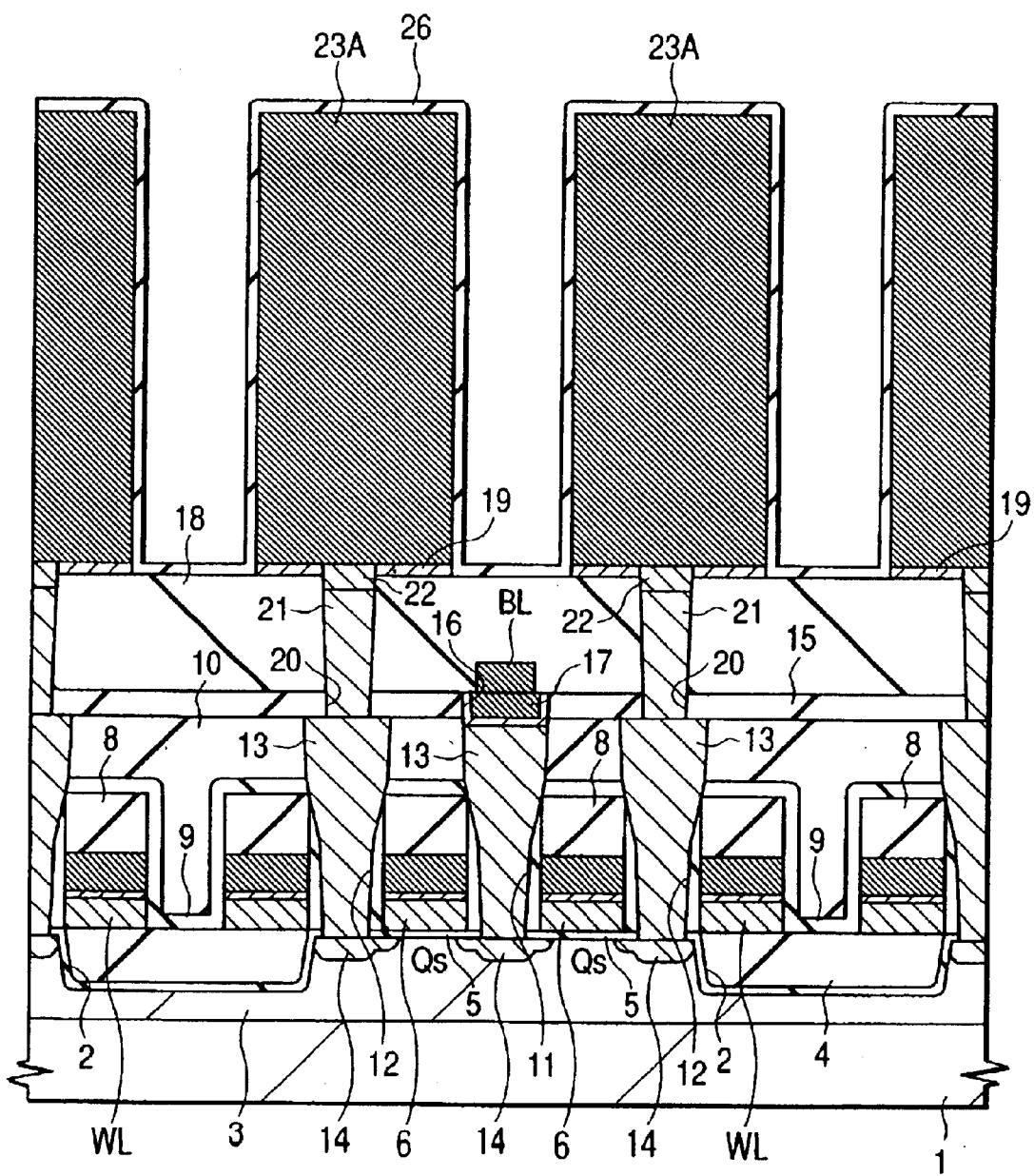
FIG. 26 is a sectional view of an essential part of a semiconductor substrate showing a mass production method of a semiconductor integrated circuit device according to the one embodiment of the invention.

As shown in FIG. 25, the TiN film 19 is dry etched through the mask of the silicon oxide film 24. For the etching of the TiN film 19, a mixed gas, for example, of boron trichloride ($BCl_3$) and chlorine is used. The etching system is, for example, an ECR plasma etching system.

Next, after removal of the silicon oxide film 24 by dry etching, a BST film 26 serving as a capacitance insulating film is deposited on the lower electrode 23A by a CVD method. Subsequently, the wafer 1 is cleaned by means of the cleaning device shown in FIGS. 12 to 14 to remove the BST film 26 deposited on the side surface and back side of the wafer 1. For this purpose, the cleaning liquid used is, for example, hdyrofluoric acid.

As a material for the capacitance insulating film, there may be used, aside from the BST used as the film 26, high dielectric materials such as $Ta_2O_5$ (tantalum oxide), and ferrodielectric materials having a perovskite crystal structure such as PZT, PLT, PLZT, SBT, $PbTiO_3$, $SrTiO_3$, $BaTiO_3$ and the like. In this case, the wafer 1 is cleaned by use of the cleaning device shown in FIGS. 12 to 14, an unnecessary high/ferro-dielectric film deposited on the side surface and back side of the wafer can be removed. For a cleaning solution of these materials, there is used, for example, hydrofluoric acid of a high concentration.

For removing crystal defects of the BST film 26, the wafer is annealed (thermally treated) in an atmosphere of oxygen at about 700° C. Where the high dielectric material such as $Ta_2O_5$, or a ferrodielectric material having a perovskite crystal structure such as PZL, PLT, PLZT, SBT, $PbTiO_3$, $SrTiO_3$ or $BaTiO_3$ is used, the wafer 1 is annealed (thermally treated) in an atmosphere of oxygen in order to remove crystal defects.

Figure 27:
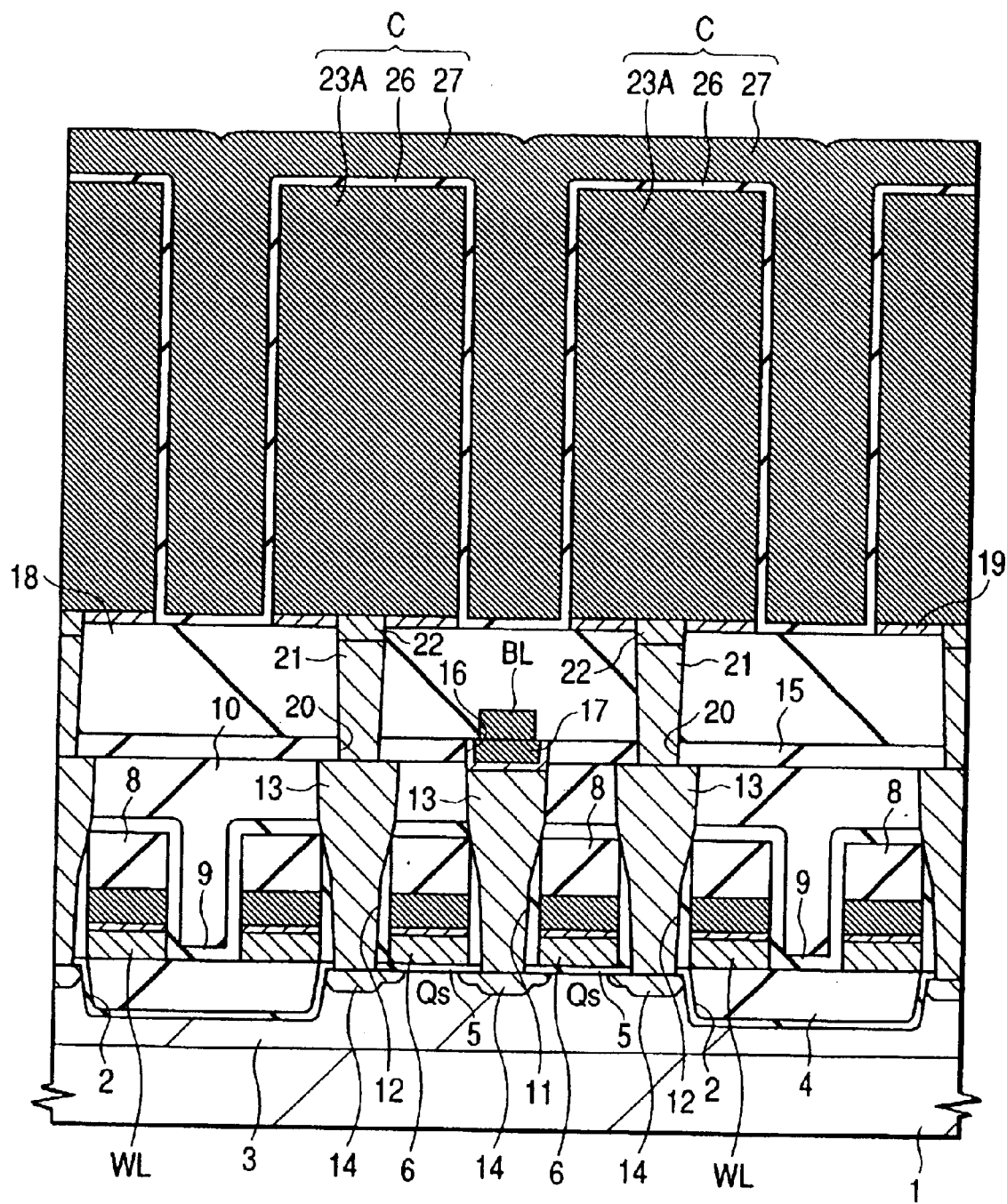
FIG. 27 is a sectional view of an essential part of a semiconductor substrate showing a mass production method of a semiconductor integrated circuit device according to the one embodiment of the invention.

As shown in FIG. 27, an Ru film 27 used as an upper electrode material is deposited on the BST film 26 by a CVD method. In this case, after the formation of the Ru film 27, the wafer 1 is cleaned by use of the cleaning device shown in FIGS. 12 to 14. When a mixed aqueous solution of orthoperiodic acid and nitric acid is used as a cleaning solution, the Ru film 27 deposited on the side surface and back side of the wafer 1 can be removed satisfactorily.

In this way, there is completed information storage capacitor element C which is constituted of the lower electrode 23A made of the Ru film 23, the capacitance insulating film made of the BST film 26, and the upper electrode made of the Ru film 27. According to the steps described hereinabove, the memory cells of DRAM, which are constituted of MISFETs for memory cell and information storage capacitor elements C connected in series therewith are completed.

Figure 28:
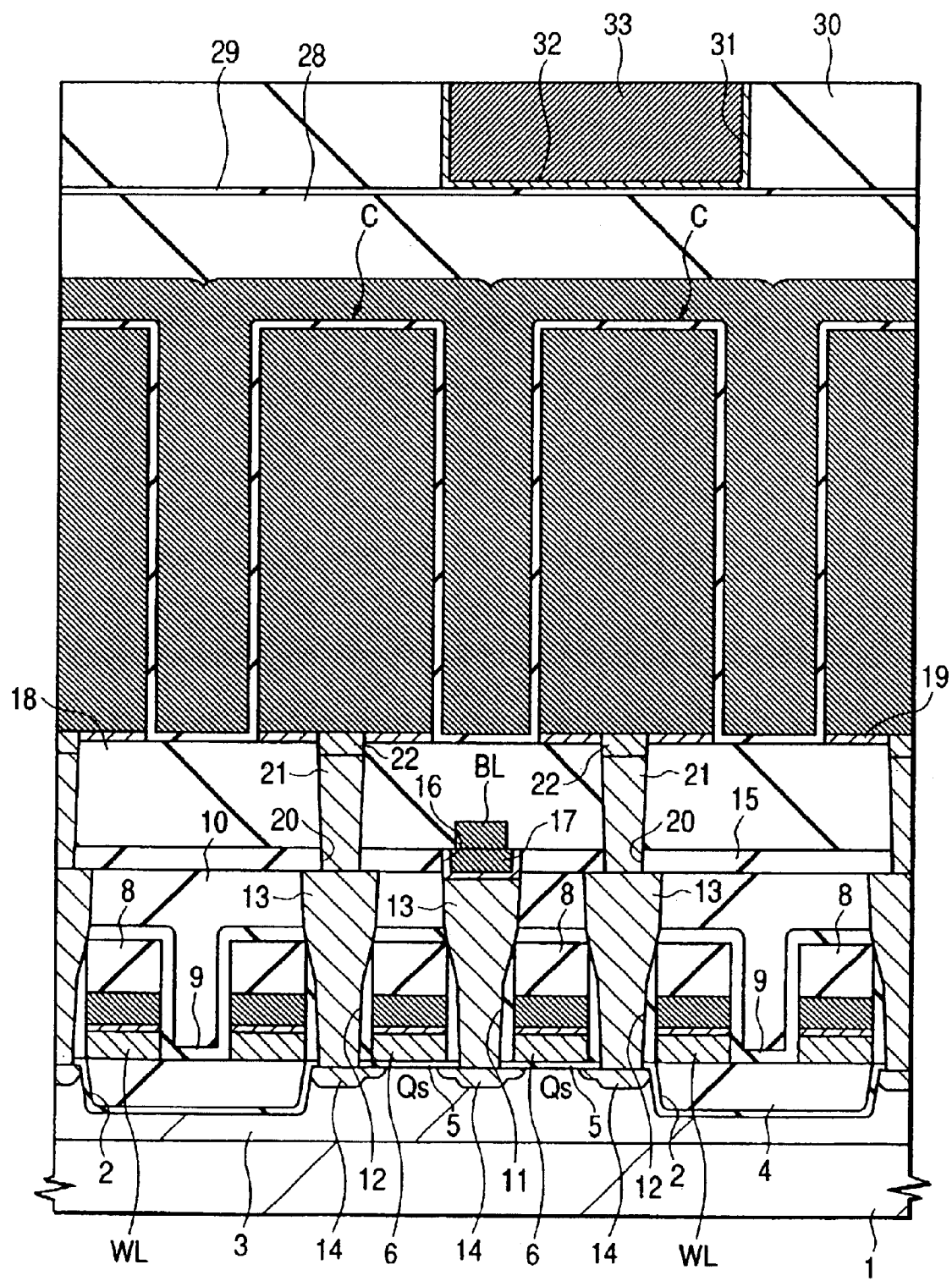
FIG. 28 is a sectional view of an essential part of a semiconductor substrate showing a mass production method of a semiconductor integrated circuit device according to the one embodiment of the invention.

Thereafter, as shown in FIG. 28, a silicon oxide film 28, a silicon nitride film 29 and a silicon oxide film 30 are successively deposited over the information storage capacitor element C by a CVD method. A wiring groove 31 is formed in the silicon oxide 30 by dry etching wherein the silicon nitride film 29 is used as an etching stopper, followed by formation of a buried Cu wiring 33 inside the wiring groove 31 via a barrier metal film 32.

For the formation of the buried Cu wiring 33, the barrier metal 32 made, for example of a TiN film, a TaN film or the like is deposited inside the wiring groove 31 and on the silicon oxide film 30 by a sputtering method (or a CVD method), followed by further deposition of a Cu film (33) on the barrier metal film 32 by a sputtering method.

In order to remove the Cu film deposited on the side surface and back side of the wafer 1, the wafer 1 is cleaned by use of the cleaning device shown in FIGS. 12 to 14. For the cleaning solution, there is used, for example, nitric acid or concentrated sulfuric acid. This cleaning enables one to prevent the wafers 1 in the lower layers steps (including the initial element formation step and wiring step prior to the formation of the gate insulating film) from contamination with Cu.

Next, the Cu film (33) is annealed (thermally treated) so that the Cu film (33) is satisfactorily buried inside the wiring groove 31, followed by formation of a buried Cu wiring 33 according to a so-called Damascene method wherein an unnecessary Cu film (33) outside the wiring groove 31 is removed by a chemical mechanical polishing method. It will be noted that the method of forming the buried Cu film 33 is described in detail in Japanese Patent Application No. Hei 11-117690 (Tanabe).

The invention of the present inventors has been particularly described based on the embodiments thereof, which should not be construed as limiting the invention and may be modified or altered in various ways without departing from the spirit of the invention.

For instance, in the above embodiments, the use of an aqueous solution as the cleaning solution, which makes use, as a solvent, of water having no problem on the reaction with a solute and the contamination of a wafer, has been described. The invention is not limited to such use, and for instance, an organic solvent or an inorganic solvent other than water may be used.

In the embodiments, the case where Ru is used as electrodes of a capacitor has been set out. The wafer cleaning method of the invention may be applied to the case where the capacitor electrodes are constituted of platinum group metals other than Ru, e.g. Pt (platinum), Ir (iridium), Rh (rhodium), Pd (palladium), Os (osmium) and the like. For a cleaning solution for the electrode made of Ir, orthoperiodic acid or the like may be used. For a cleaning solution of Pt, aqua regia is used, and the a cleaning solution of Pd, aqua regia or concentration nitric acid is used.

The invention is applicable not only to DRAM using a transition metal-containing film as a capacitor material, but also CMIS integrated circuits wherein a gate insulating film of MISFET is constituted, for example, of a high dielectric material such as $Ta_2O_5$ (tantalum oxide).

The effects obtained by typical embodiments disclosed in the invention are briefly described below.

According to the invention, in the semiconductor mass production process wherein a lithographic device, inspection devices, an annealing device and the like are commonly used in an initial element formation step, a wiring step and a transition metal-containing film processing step prior to the formation of a gate insulating film, the contamination of wafers, subjected to the initial element formation step and the wiring step by use of the above devices, with a transition metal can be reliably prevented.

EXAMPLE 2

The summary of another example of the invention can be itemized in the following way.

1. A method of treating a solid surface wherein a treating solution containing an oxidizing agent is fed to the solid surface to subject the solid surface to etching treatment, characterized in that the oxidizing agent is able to yield an oxygen atom to the solid surface and has an oxidation reduction potential higher than that of the solid.

2. A method of treating a solid surface as recited in 1 above, characterized in that the treating solution comprises at least one of a hypochlorite ion, a chlorite ion, a chlorate ion, a perchlorate ion, a hypobromite ion, a bromite ion, a bromate ion, a perbromate ion, a hypoiodite ion, an iodite ion, an iodate ion, a periodate ion, a permanganate ion, a chromate ion, a dichromate ion, a nitrate ion and a nitrite ion, and the treating solution is fed to the solid surface.

3. A method of treating a solid surface as recited in 1 above, characterized in that the solid contains, at least, ruthenium or osmium.

4. A treating solution of the type which is fed to a solid surface for etching the surface, characterized in that the solution contains an oxidizing agent for yielding an oxygen atom, at least, to the solid surface, and the oxidizing agent has an oxidation reduction potential higher than that of the solid.

5. A treating solution as recited in 4 above, characterized in that the treating solution comprises at least one of a hypochlorite ion, a chlorite ion, a chlorate ion, a perchlorate ion, a hypobromite ion, a bromite ion, a bromate ion, a perbromate ion, a hypoiodite ion, an iodite ion, an iodate ion, a periodate ion, a permanganate ion, a chromate ion, a dichromate ion, a nitrate ion and a nitrite ion.

The invention relates to a treating solution and method of a solid surface in an electronic device production process, and more particularly, to a treating solution and method suitable for the production of a semiconductor device, a heating resistor and the like.

In general, the process of dissolving a solid, such as a metal, in a treating solution by chemical reaction between the solid and the treating solution in an electronic device production process has been widely applied to an etching method, which is one of solid processing methods, a cleaning method of removing a specific foreign matter from a solid surface, and the like. The treating solution is a fluid or a stationary body containing at least a liquid, and may be made of a liquid phase alone, a combination of a liquid phase and a gas phase, and a combination of a liquid phase and a solid phase. Moreover, the liquid phase in the treating solution may be constituted of two or more liquid phases without limitation.

However, for carrying out a reaction such as of etching or dissolution of the solid, an oxidizing agent is essentially required. For instance, where copper is etched, there is used, as an oxidizing agent, a potassium hexacyanoferrate (III) aqueous solution, a sodium acidic peroxodisulfate aqueous solution or the like. The metal such as copper, chromium or the like is oxidized by means of these oxidizing agents and is dissolved in the solution by bonding to an appropriate ligand. This ligand may be the molecules of a solvent, e.g. the molecules of water, to which ammonia or a cyanide may be added, if necessary.

On the other hand, in the production step of an electronic device such as a silicon semiconductor, it is usual to mainly use hydrogen peroxide as an oxidizing agent. The reason for this is that where an oxidizing agent containing a metal element such as a hexacyanoferrate (III) ion is used, there is the apprehension that the semiconductor device may be newly contaminated with the metal element contained in the oxidizing agent, and thus, the use of a metal element-free oxidizing agent is essential and a technique of rendering hydrogen peroxide highly pure has been established, hydrogen peroxide can be readily utilized industrially.

For one instance, a metal such as cobalt, titanium or the like, which is used in the formation step of a source electrode and a drain electrode on an electric field effect transistor, is dissolved in an aqueous solution made of hdyrochloric acid and hydrogen peroxide, or an aqueous solution made of ammonia and hydrogen peroxide. For the removal of a metal element from the surface of a semiconductive wafer, there is well used an aqueous solution containing hydrochloric acid and hydrogen peroxide, an aqueous solution containing sulfuric acid and hydrogen peroxide, or an aqueous solution containing hydrofluoric acid and hydrogen peroxide.

The conditions which an oxidizing agent should satisfy include an oxidation reduction potential of an oxidizing agent used higher than that of a solid to be processed. More particularly, with the etching of copper in prior art example, for instance, as set out in The Handbook of Chemistry, Revised Edition 4, Fundamentals II (hereinafter referred to as literature 1), the oxidation reduction potential of $Cu^{2+}/Cu$ is at 0.340 V (based on the standard hydrogen electrode: the potential is hereinafter referred to as that based on the standard hydrogen electrode). The oxidation of copper is promoted by means of the hexacyanoferrate (III) ion (oxidation reduction potential: 0.361 V) or peroxodisulfate ion (oxidation reduction potential: 1.96 V), but the oxidation reaction of oxygen does not take place by means of a hexacyanochromate (III) ion (oxidation reduction potential: −1.14 V).

Accordingly, the above electrochemical reaction has to be taken into account with respect to the etching treatment of a metal, which is employed in recent advancement, such as of a high degree of integration, a high speed and the like, of semiconductor devices, e.g. a noble metal such as ruthenium.

However, hydrogen peroxide, which has been hitherto, ordinarily employed in the art, cannot be used for dissolution of a noble metal such as ruthenium or the like. More particularly, in spite of the fact that hydrogen peroxide has an oxidation reduction potential (oxidation reduction potential of $H_2O_2/H_2O$ of 1.763 V at pH=0, from literature 1) higher than the oxidation reduction potential of ruthenium, a satisfactory etching rate of ruthenium with a treating solution using hydrogen peroxide cannot be obtained.

Moreover, when using a chemical solution containing a peroxodisulfate or nitric acid, which has been conventionally used for etching or copper or iron, it has been difficult to obtain a satisfactory etching rate for a noble metal such as ruthenium or the like.

In view of the above-stated circumstances in the art, there has been widely demanded a development of a treating solution, which has an adequate etching rate against the noble metal, in the production process of semiconductor devices. If this can be realized, semiconductor devices exhibiting an excellent performance are obtainable, thus contributing greatly to the development in the industrial field such as of communication, information, picture display and the like.

For instance, it is known that ruthenium, which is one of platinum group, noble metal elements, is very unlikely to undergo oxidation, so that it is necessary to use an oxidizing agent having an intense oxidizing force, or a high oxidation reduction potential for its oxidation treatment.

When taking the etching of ruthenium into account, it is necessary to convert ruthenium into ruthenium tetraoxide ($RuO_4$) wherein ruthenium is bonded to four oxygen atoms, thereby ensuring the dissolution thereof.

The standard electrode potential of ruthenium and ruthenium tetraoxide is at 1.13 V at pH 0 (M. Pourbaix: "Atlas of Electrochemica Equilibira in Aqueous Solutions", 1st English Edition, Chapter IV, Pargamon, Oxford (1996), hereinafter referred to as literature 2). The potential at which ruthenium tetraoxide is electrochemically formed from ruthenium further increases, including an overpotential, and is reported to be at 1.4 to 1.47 V (literature 2) Accordingly, an oxidizing agent used to etch ruthenium, for example, at pH=0 should have an oxidation reduction potential of, at least, 1.13 V, preferably 1.4 V or over.

For the dissolution by oxidation of ruthenium, the bonding to oxygen is essential as will be seen from the reaction formula of the product. Accordingly, mention may be made, as a candidate for a source of supplying an oxygen atom, of an oxidizing agent or water. In this connection, the activity of water is kept substantially constant in an aqueous solution, so that it is effective for efficient oxidation dissolution of ruthenium to use an oxidizing agent which is able to positively release an oxygen atom.

In other words, it is necessary that an oxidizing agent used to form a compound bonded with oxygen and efficiently dissolve such a compound as with the case of a noble metal such as ruthenium have an oxidation reduction potential higher than the oxidation reduction potential of the dissolution reaction of a metal to be dissolved out and that the oxidizing agent be able to release an oxygen atom in the course of the reaction.

It will be noted that the oxidizing agent capable of releasing an oxygen atom in the course of the oxidation reaction means one which is described below: the oxidizing agent is such an agent that when an atom whose oxidation number is reduced during the reaction is called oxidation center atom among the atoms constituting an oxidizing agent, one or plural oxygen atoms bonded to the oxidation center atom cut off bonding with the oxidation center atom and freshly join to an atom to be oxidized.

Next, the mechanism of efficiently dissolving ruthenium by oxidation with an oxidizing agent capable of releasing an oxygen atom is now described.

A number of reports have been provided with respect to the oxidation reaction of a ruthenium ion, not a ruthenium metal, and for example, a nitrosylruthhenium ion ($[Ru^{11}(NO)]_3^+$) is oxidized into ruthenium tetraoxide by means of nitric acid or a cerium (IV) ion.

However, according to our study, ruthenium metal is not oxidized and dissolved with nitric acid or a cesium (IV) ion. The reason why ruthenium metal is not oxidized and dissolved by means of nitric acid is that nitric acid does not have an oxidation reduction potential (a standard electrode potential of $HNO_3/NO_2^-$ is at 0.835 V: literature 1) necessary for the oxidation of the ruthenium metal.

The reason that ruthenium is not oxidized and dissolved by means of the cerium (IV) ion is that as shown in the following formula (1), any oxygen atom is not released i-n the course of the reaction $$Ce_4^+ + e^- \rightarrow Ce_3^+ \tag{1}$$

From the above, it will be seen that whether or not an oxidizing agent is able to release an oxygen atom does not take great part in a further oxidation process of a ruthenium ion having a positive oxidation number, but the release of an oxygen atom from an oxidizing agent is essential for the process of oxidizing and dissolving a ruthenium metal having an oxidation number of 0.

The metal to be dissolved is not limited to ruthenium, and the above may be applied to other noble metal such as, for example, osmium. The oxidizing agent suited for the dissolution of these noble metals contains an oxygen atom-donating oxidizing agent. Such an oxidizing agent may be ones which contain any one of a hypochlorite ion, a chlorite ion, a chlorate ion, a perchlorate ion, a hypobromite ion, a bromite ion, a bromate ion, a perbromate ion, a hypoiodite ion, an iodite ion, an iodate ion, a periodate ion, a permanganate ion, a chromate ion, a dichromate ion, a nitrate ion and a nitrite ion.

Other examples of the invention are described in detail.

A ruthenium metal as a typical example of a noble metal was used, and the etching effect of oxidizing agents containing different types of ions was determined, with the results shown in Table 1.

Etching was performed according to a well-known procedure. More particularly, a ruthenium thin film (with a film thickness of 200 nm) was formed on a silicon wafer (20×40 mm) according to an ordinary sputtering method. A photoresist film was applied onto part of the ruthenium thin film and baked by a well known method, followed by immersion of the wafer in a solution containing an oxidizing agent at room temperature for 10 to 30 minutes. Thereafter, the wafer was well washed with water and the photoresist film was removed by a well-known method, followed by measuring an etching step formed on the surface of the ruthenium thin film by means of an ordinarily employed contact finger-type step meter The measurement of a film thickness may not be limited to the above method, but a method using, for example, a fluorescent X-ray may be used without limitation.

TABLE 1

Oxidation reduction potential of oxidizing agents and dissolution rate of ruthenium

| | Oxidation reduction potential (V) | Dissolution rate (nm/min) |
|---|---|---|
| Peroxodisulate ion | 1.96 | <0.1 |
| Hydrogen peroxide | 1.76 | <0.1 |
| Hypochlorite ion | 1.72 | 82.4 |
| Cesium (IV) ion | 1.61 | <0.1 |
| Periodate ion | 1.60 | 13.7 |
| Borate ion | 1.52 | 5.5 |
| Nitric acid | 0.84 | <0.1 |
| Iodine | 0.54 | <0.1 |

As will be apparent from these results, little dissolution of ruthenium metal was recognized when using oxidizing agents containing hydrogen peroxide, cerium (IV) ion, nitric acid and iodine, and a remarkable degree of etching of ruthenium was recognized when using the hypochlorite, bromate and periodate These oxidizing agents can release an oxygen atom in the following reactions.

$$ClO^- \rightarrow Cl^- + (O) \quad (2)$$

$$BrO_3^- \rightarrow Br^- + 3(O) \quad (3)$$

$$IO_4^- \rightarrow IO_3^- + (O) \quad (4)$$

$$H_4IO_6^- \rightarrow IO_3^- + 2H_2O + (O) \quad (5)$$

On the other hand, there are some oxidizing agents having an oxidation reduction potential enough to oxidize the ruthenium metal, with which etching of the ruthenium metal was scarcely recognized. For instance, a peroxodisulfate or iodine does not release any oxygen atom as will be seen in the following reaction formulas.

$$S_2O_8^{2-} + 2e^- \rightarrow 2SO_4^{2-} \quad (6)$$

$$I_2 + 2e^- \rightarrow 2I^- \quad (7)$$

Accordingly, since the oxygen atom to be bonded to ruthenium is not supplied from the oxidizing agent, the etching of ruthenium metal does not proceed, or it can be said that the etching is so slow as not to be confirmed by an ordinary method.

The difference in behavior between the oxidizing agent capable of releasing an oxygen atom and the oxidizing agent incapable of releasing an oxygen atom as illustrated above is schematically shown in FIG. 29.

As for hydrogen peroxide, there are two reactions including a reaction wherein an oxygen atom is released (formula 8) and a reaction wherein an oxygen atom is not released but the peroxide is decomposed into two OH$^-$ ions (formula 9).

$$H_2O_2 + 2e^- \rightarrow 2OH^- \quad (8)$$

$$I_2 + 2e^- \rightarrow 2OH^- \quad (9)$$

However, as will be apparent from the results of Table 1, the etching of ruthenium metal is not recognized, so that it is considered that with a treating solution made of hydrogen peroxide, the reaction (9) proceeds. As stated above, although the oxidation reduction potential of hydrogen peroxide is larger than that of ruthenium metal, any oxygen atom is not released in the reaction, thus disenabling the etching to proceed.

Figure 29A:
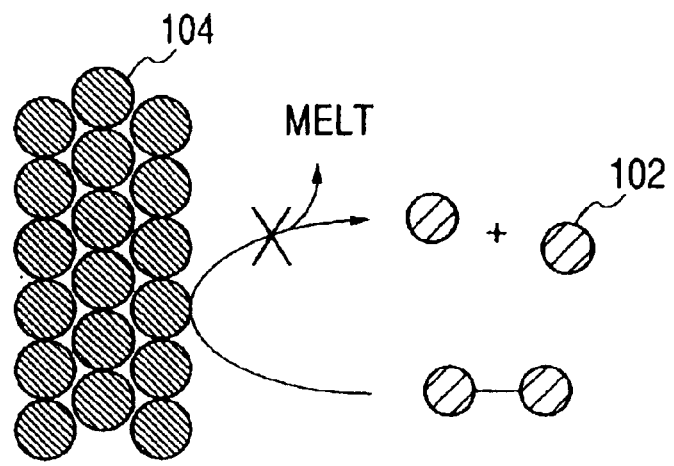
FIGS. 29(a) and 29(b) are, respectively, a view illustrating the difference in behavior between the oxidizing agent capable of releasing oxygen atoms and the oxidizing agent incapable of releasing oxygen atoms.

In FIG. 29, (a) shows the case where an oxidizing agent incapable of releasing oxygen atom 101, i.e. iodine, is used. Iodine atom 102 is converted to two iodide ions through the reaction, and any oxygen atom 101 is not released.

Figure 29B:
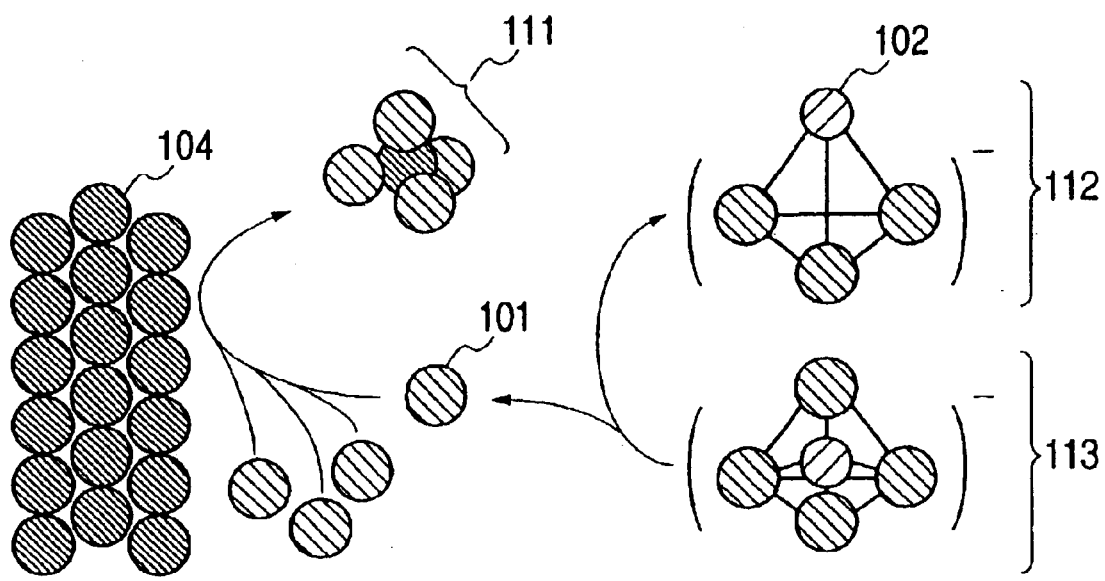

As a consequence, ruthenium metal does not receive any oxygen atom 101 and cannot be converted to ruthenium tetraoxide (RuO$_4$) 111 and is not dissolved. On the other hand, FIG. 29(b) shows the case where there is used metaperiodate ion 113 serving as an oxidizing agent capable of releasing the oxygen atom 101. Metaperiodate has four oxygen atoms in one ion and releases one atom in the course of the reaction, resulting in iodate ion 112 having three oxygen atoms. Ruthenium receives the oxygen atom 101 released during the reaction, and converts to ruthenium tetraoxide 111 and is thus dissolved.

As stated above, where a noble metal such as ruthenium metal is dissolved for etching, a treating solution therefor should contain, at least, hypochloric acid, bromic acid or periodic acid, by which the treatment can be carried out within a range of practical time.

It is to be noted that the treating solution should not be construed as limiting to those solutions containing hypochloric acid, bromic acid or periodic acid, but any solutions containing an oxidizing agent capable of releasing an oxygen atom, or an oxygen atom-donating oxidizing agent, ensures a similar treating effect, like this example.

EXAMPLE 3

Figure 30:
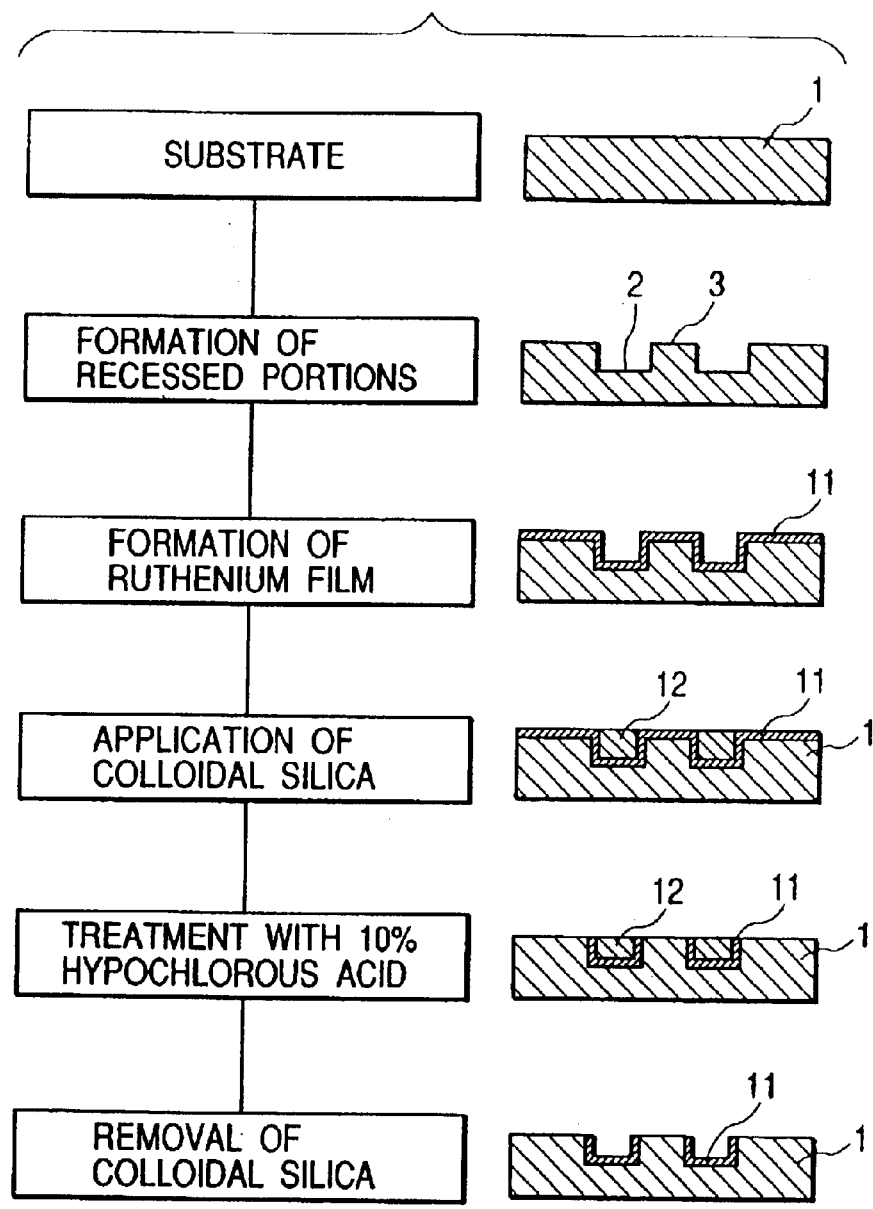
FIG. 30 is a view illustrating processing steps of a ruthenium thin film according to a second example.

The processing example of an electronic device is illustrated as Example 3 with reference to FIG. 30.

FIG. 30 is a flow chart wherein a recess 2 and a protrusion 3 are formed on a substrate 1 according to a well-known processing method, e.g. a wet etching method, a dry etching method or a mechanical polishing method, on which a ruthenium thin film 11 is formed, for example, by a well-known sputtering method.

Next, a colloidal silica solution is applied thereon in an appropriate amount and dried to cover the recess 2 alone with the colloidal silica 12. Thereafter, the substrate 1 is immersed in a 10% potassium hypochlorite aqueous solution to remove the ruthenium thin film from the protrusion 3, thereby forming a cup-shaped ruthenium film pattern on the side and bottom surfaces of the recess 2.

Thus, in the production process of an electronic device wherein the ruthenium thin film is formed only inside the groove provided in the substrate through etching of the ruthenium thin film, when a solution containing an oxygen atom-donating oxidizing agent, e.g. a solution containing a hypochlorous acid, is used, the etching treatment can be carried out within a range of a practical time, thus enabling one to make an electronic device.

It will be noted that the treating solution is not limited to a solution containing a hypochlorous acid, and a similar treating effect can be obtained as in this example when using a solution which contains an oxygen atom-donating oxidizing agent such as bromic acid or periodic acid.

EXAMPLE 4

Figure 31:
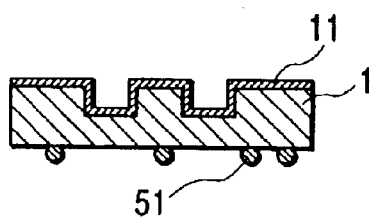
FIG. 31 is a view illustrating a cleaning step of ruthenium fine particles according to a third example.

Examples 4 is described with reference of FIG. 31 Where the ruthenium film 11 is formed on the substrate 1 set out in Example 1, there are a multitude of ruthenium fine particles 51 in a film formation chamber of the device. Accordingly, the substrate 1, on which the ruthenium thin film 11 has been formed on one surface thereof, is deposited on the other surface with a multitude of ruthenium fine particles.

For one instance, when the concentration of ruthenium, which is present in a surface (a back surface) opposite to the surface of the substrate 1 on which the ruthenium thin film 11 has been formed, was measured by a well-known total reflection fluorescent X-ray analysis, with the result that the number of the fine particles was found to be at $2\times10^{18}$ atoms/m$^2$. A 50% orthoperiodic acid aqueous solution was supplied only to the back surface of the substrate 1, followed by washing for 2 minutes. As a result, the concentration was reduced to $2\times10^{15}$ atoms/m$^2$.

In this way, not only the etching of a noble metal thin film, but also the removal of noble metal fine particles deposited on a substrate can be effectively carried out by supplying a solution containing an oxygen atom-donating oxidizing agent to the substrate surface deposited with the fine particles to be removed.

EXAMPLE 5

A fifth example is described.

In this example, a noble metal to be treated is osmium, and the osmium metal is converted to osmium tetraoxide (OsO$_4$) through the reaction similar to the case of ruthenium metal and is thus dissolved.

For one instance, a substrate whose surface is contaminated with the fine particles of an osmium metal was cleaned in a manner set out in Example 3. As a result, the concentration of the osmium fine particles existing in the substrate prior to the cleaning was found to be at $5\times10^{18}$ atoms/m$^2$. When the substrate was cleaned by use of an about 1 mol/l potassium permanganate aqueous solution adjusted to pH=1 for about 5 minutes, the concentration of the fine particles was reduced to $5\times10^{15}$ atoms/m$^2$.

Using a treating fluid of the invention, the etching and dissolution of a metal solid, which have been hitherto difficult, become possible within a range of a practical time.

What is claimed is:

1. A fabrication method of a semiconductor integrated circuit device comprising the steps of:
   (a) forming an insulating film over a device surface of a wafer;
   (b) forming a wiring groove in the insulating film by first lithographic treatment;
   (c) depositing a copper film over the insulating film and in the wiring groove in the insulating film over the device surface;
   (d) after step (c), cleaning an outer edge portion of the device surface and an entire area of a back surface of the wafer with cleaning liquid, which can dissolve copper, without applying the cleaning liquid to a central region of the device surface;
   (e) removing the deposited copper film outside the wiring groove by chemical mechanical polishing;
   (f) after steps (d) and (e), subjecting the wafer to a second lithographic treatment without subjecting the wafer to any lithographic treatment between steps (b) and (f).

2. A fabrication method of a semiconductor integrated circuit device as defined in claim 1, wherein step (d) is performed before step (e).

3. A fabrication method of a semiconductor integrated circuit device as defined in claim 1, wherein the cleaning liquid is nitric acid or sulfuric acid.

* * * * *